United States Patent
Inoue et al.

(10) Patent No.: US 10,399,817 B2
(45) Date of Patent: Sep. 3, 2019

(54) ELEVATOR CAR POSITION DETECTION DEVICE

(71) Applicant: Mitsubishi Electric Corporation, Chiyoda-ku (JP)

(72) Inventors: Jin Inoue, Chiyoda-ku (JP); Emiko Kurata, Chiyoda-ku (JP); Yoshimasa Watanabe, Chiyoda-ku (JP); Akihide Shiratsuki, Chiyoda-ku (JP); Hiroshi Nishizawa, Chiyoda-ku (JP); Hajime Nakajima, Chiyoda-ku (JP); Masahiro Ishikawa, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 142 days.

(21) Appl. No.: 14/654,977

(22) PCT Filed: Mar. 1, 2013

(86) PCT No.: PCT/JP2013/055652
§ 371 (c)(1),
(2) Date: Jun. 23, 2015

(87) PCT Pub. No.: WO2014/132435
PCT Pub. Date: Sep. 4, 2014

(65) Prior Publication Data
US 2015/0344266 A1 Dec. 3, 2015

(51) Int. Cl.
*G01D 5/20* (2006.01)
*B66B 1/34* (2006.01)
*H03K 17/97* (2006.01)

(52) U.S. Cl.
CPC ............ *B66B 1/3492* (2013.01); *G01D 5/20* (2013.01); *G01D 5/2053* (2013.01); *H03K 2017/9706* (2013.01)

(58) Field of Classification Search
CPC ...... B66B 1/3492; G01D 5/2053; G01D 5/20; H03K 2017/9706
See application file for complete search history.

(56) References Cited

U.S. PATENT DOCUMENTS 4,503,392 A * 3/1985 Fastritsky .......... G01N 27/9046
324/232
6,124,708 A * 9/2000 Dames ................ G01D 5/2053
324/207.12
(Continued)

FOREIGN PATENT DOCUMENTS

JP 50 57657 5/1975
JP 2009 263108 11/2009
(Continued)

OTHER PUBLICATIONS

International Search Report dated Apr. 9, 2013 in PCT/JP2013/055652 Filed Mar. 1, 2013.
(Continued)

Primary Examiner — Akm Zakaria
(74) Attorney, Agent, or Firm — Xsensus LLP

(57) ABSTRACT

In an elevator car position detection device, a magnetic field generator generates an eddy current magnetic field on an identification member, and a magnetic field detector detects the eddy current magnetic field generated on the identification member. The identification member includes a plurality of conductors which are continuously arranged along an ascending and descending direction of a car, and are relatively different in a plate thickness with respect to a skin depth of an eddy current generated by the magnetic field generator on the identification member. A shape of at least a part of a boundary between the adjacent conductors is a straight line or a curve tilted with respect to a direction orthogonal to the ascending and descending direction of the car.

20 Claims, 20 Drawing Sheets

(56) References Cited

U.S. PATENT DOCUMENTS

| | | | | |
|---|---|---|---|---|
| 2007/0194781 A1* | 8/2007 | Zhitomirskiy | ......... | G01D 5/204 |
| | | | | 324/207.17 |
| 2011/0114425 A1* | 5/2011 | Meri | .................... | B66B 1/3492 |
| | | | | 187/394 |
| 2012/0095686 A1* | 4/2012 | Legendre | .............. | E21B 47/082 |
| | | | | 702/6 |

FOREIGN PATENT DOCUMENTS

| | | |
|---|---|---|
| JP | 4599427 | 12/2010 |
| JP | 2012 162383 | 8/2012 |

OTHER PUBLICATIONS

Office Action dated Aug. 2, 2016 in Chinese Patent Application No. 201380073816.0 (with Partial English language translation).

\* cited by examiner

1

ELEVATOR CAR POSITION DETECTION DEVICE

TECHNICAL FIELD

The present invention relates to an elevator car position detection device for detecting a position of a car through detection of an identification member with a sensor.

BACKGROUND ART

In a related-art elevator, a car and a counterweight are suspended in a hoistway by a plurality of main ropes. The main ropes are wound around a drive sheave of a hoisting machine. Then, the car and the counterweight are raised and lowered by a motor of the hoisting machine rotating the drive sheave.

An encoder for generating an incremental pulse in response to a rotation of a rotational shaft of the motor is connected to the motor. The position of the car can be detected by counting the incremental pulse from the encoder.

However, actually, the main ropes slip on the drive sheave, and the main ropes are elongated. Therefore, in the method of counting the output pulse of the encoder, a difference may be generated between a detected car position and an actual car position. In other words, when the car is intended to land on a certain floor, and the motor is controlled based on the output pulse count of the encoder so that a step between a floor surface of the car and a floor surface of a landing is zero, a landing error, namely, a step may be generated.

In contrast, there is known a method of detecting a metal plate installed at a position with a certain height from the floor surface of the landing by a detector installed on the car, thereby preventing a generation of the step. In this method, when an edge of the metal plate is detected by the detector, a remaining distance to a planned stop floor acquired based on the output pulse count of the encoder is once reset. Then, a distance (set value) from the floor surface of the landing to the installed position of the metal plate is reflected to the motor control. Note that, a region (a range of the metal plate) in which the reset is carried out is usually referred to as a door zone.

Moreover, the Building Standards Act prohibits a door open operation in a state in which the floor surface of the car and the floor surface of the landing are separated by a certain height or more. Therefore, a function of determining whether or not the position of the car is in a door open operation permission zone (re-level zone) is also necessary.

As an elevator landing position detection device having a function of detecting the edge of the identification plate such as a metal plate and a function of determining whether or not the car is in the re-level zone, for example, there are known detection devices of an optical type using an photoelectric sensor, a magnetic type using a magnetic sensor or a magnetic reed switch, an electrostatic capacitance type, an eddy current type, and a resonance coil type.

The optical type out of those types can highly precisely detect the identification plate, but has such a disadvantage as being sensitive to dust, water drops, and ambient light. In contrast, the magnetic type, the electrostatic capacitance type, the eddy current type, and the resonance coil type are excellent in environment resistance as compared to the optical type. Therefore, the types other than the optical type are generally used for switches and sensors used in a safety system for preventing a serious incident in the elevator.

For example, in a related-art car position detection device of the eddy current type, a metal conductive identification plate is installed on a guide rail for guiding raising and lowering of a car, and a detector of the eddy current type is installed on the car. Then, an output signal from the detector of the eddy current type at the time when the detector of the eddy current type is opposed to the identification plate is used to detect a position and a speed of the car (for example, refer to Patent Literature 1).

CITATION LIST

Patent Literature

[PTL 1] JP 4599427 B2

SUMMARY OF INVENTION

Technical Problems

In the related-art car position detection device of the eddy current type, the output of the detector greatly varies depending on a variation in a distance between the identification plate and the detector. Therefore, when the output from the sensor is divided by two thresholds in order to distinguish between and detect the re-level zone and the door zone, there is such a problem in that a resistance against the variation in the distance between the identification plate and the detector decreases.

Moreover, when the door zone and the re-level zone are detected by independent position detection devices, the detectors and the identification plates as many as the number of zones to be detected are required, and there is such a problem in that the cost drastically increases.

The present invention has been made to solve the above-mentioned problems, and therefore has an object to provide an elevator car position detection device capable of detecting a position of a car for a plurality of zones more precisely at low cost.

Solution to Problems

According to one embodiment of the present invention, there is provided an elevator car position detection device that is configured to detect a position of a car by detecting an identification member by a sensor, in which: the sensor includes a magnetic field generator configured to generate an eddy current magnetic field on the identification member, a magnetic field detector configured to detect the eddy current magnetic field generated on the identification member, and a signal processing part connected to the magnetic field detector; the identification member includes a plurality of conductors which are continuously arranged along an ascending and descending direction of the car, and are relatively different in a plate thickness with respect to a skin depth of an eddy current generated by the magnetic field generator on the identification member; a shape of at least a part of a boundary between adjacent ones of the plurality of conductors is a straight line or a curve tilted with respect to a direction orthogonal to the ascending and descending direction of the car; and the signal processing part identifies, when the sensor detects the identification member, in which of ranges of the plurality of conductors of the identification member the car is positioned based on information on an amplitude and a phase of the eddy current magnetic field acquired from an output of the magnetic field detector.

Advantageous Effects of Invention

In the elevator car position detection device according to the one embodiment of the present invention, the identification member includes the plurality of conductors relatively different in the plate thickness with respect to the skin depth of the eddy current generated by the magnetic field generator on the identification member, and when the sensor detects the identification member, in which of ranges of the conductors of the identification member the car is positioned is identified based on the information on the amplitude and the phase of the eddy current magnetic field acquired from the output of the magnetic field detector. Therefore, it is possible to detect the position of the car for a plurality of zones more precisely at low cost. Moreover, the shape of at least a part of the boundary between the conductors adjacent to each other is set as the straight line or the curve tilted with respect to the direction orthogonal to the ascending and descending direction of the car. Thus, even when the position of the sensor is shifted by a lateral swing of the car with respect to the identification member, a reduction in the eddy current magnetic field generated on a part adjacent to the boundary may be suppressed, and the shift in the detection position may thus be suppressed, resulting in an increase in position detection precision.

DESCRIPTION OF EMBODIMENTS

Figure 1:
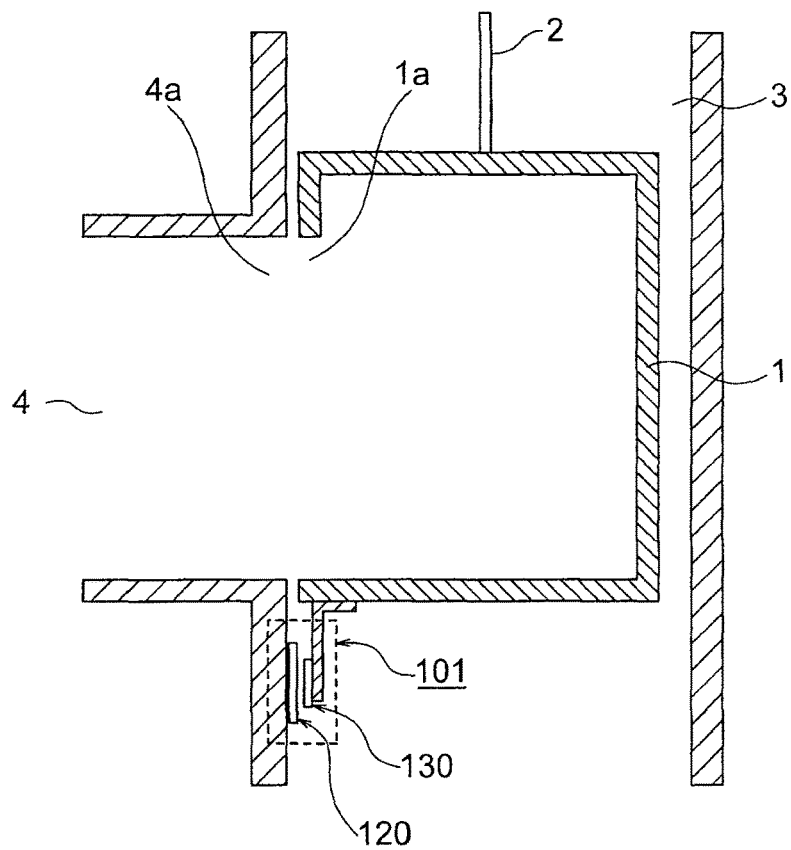
FIG. 1 is a schematic configuration diagram illustrating a main part of an elevator of a first embodiment of the present invention.

A description is now given of embodiments of the present invention referring to the drawings.

First Embodiment

FIG. 1 is a schematic configuration diagram illustrating a main part of an elevator of a first embodiment of the present invention. In FIG. 1, a car 1 and a counterweight (not shown) are suspended by suspension means 2 in a hoistway 3, and are raised and lowered by a hoisting machine (not shown). As the suspension means 2, a plurality of ropes or belts are used.

The hoisting machine includes a drive sheave, a motor for rotating the drive sheave, and a brake for braking the rotation of the drive sheave. The suspension means 2 is wound around the drive sheave. An encoder for generating an incremental pulse in response to a rotation of a rotational shaft of the motor is connected to the hoisting machine.

A car doorway 1a is formed in a front surface of the car 1. The car doorway 1a is opened and closed by a car door device (not shown). Landing doorways 4a are respectively formed in landings 4 on a plurality of floors. Each landing doorway 4a is opened and closed by a landing door device (not shown). FIG. 1 illustrates a state in which a height of a floor surface of the car 1 matches a height of a floor surface of the landing 4 on a certain floor.

A plurality (only one is illustrated in FIG. 1) of identification plates 120 serving as identification members are installed on the hoistway 3. The identification plate 120 is arranged on a side wall of the hoistway 3 in correspondence to a door zone. Moreover, in this example, the identification plate 120 is arranged at a position by a predetermined distance downward from the floor surface of the landing 4.

A sensor 130 for detecting the identification plate 120 is installed on the car 1. The sensor 130 is installed on a bottom part on the front surface (on the landing 4 side) of the car 1, and is opposed to the identification plate 120 via a gap when the sensor 130 is positioned at the same height as that of the identification plate 120. A car position detection device 101 includes the identification plates 120 and the sensor 130.

Note that, the sensor 130 may be installed on any part of the car 1 as long as the sensor 130 can detect the identification plate 120. Similarly, the identification plate 120 may be installed at any position of the hoistway 3. Moreover, two or more sensors 130 may be installed on the hoistway 3, and one identification plate 120 may be installed on the car 1.

An elevator control device (not shown) can detect the position of the car 1 by counting the incremental pulse from the encoder. As described above, the count of the pulse is reset when the car position detection device 101 detects the door zone, and, then, the motor is controlled based on a set value so that the car 1 lands on a predetermined floor.

Figure 2:
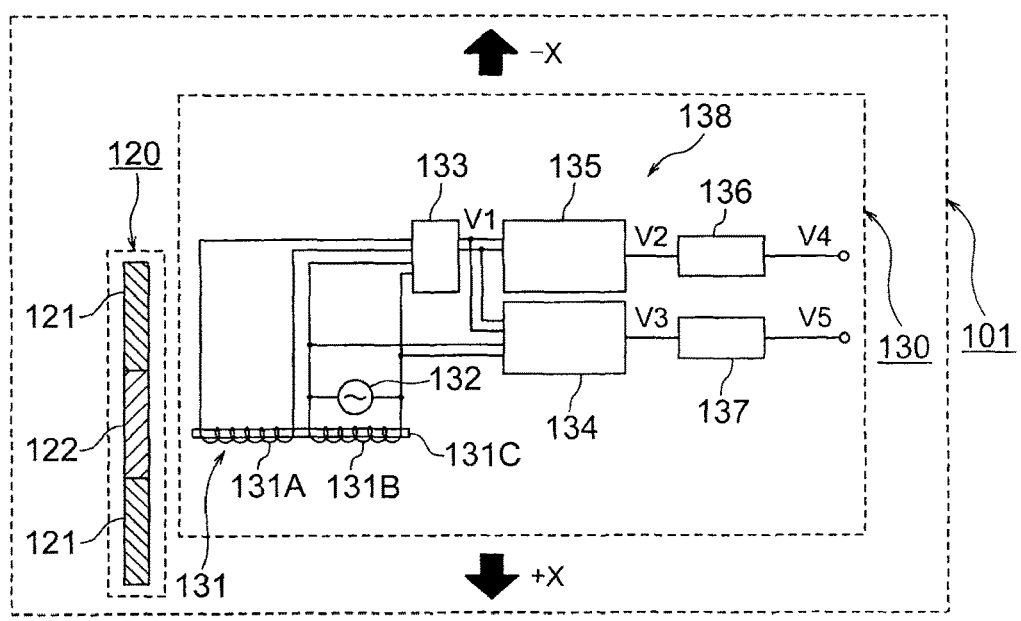
FIG. 2 is a configuration diagram illustrating a car position detection device of FIG. 1.

FIG. 2 is a configuration diagram illustrating the car position detection device 101 of FIG. 1. Note that, the identification plate 120 is fixed on the side wall of the hoistway 3 also in FIG. 2. Then, the sensor 130 is installed on the car 1, and moves along with the car 1 in ±X directions (an ascending and descending direction of the car 1).

Each identification plate 120 includes a pair of first conductors 121 and a second conductor 122 arranged between the first conductors 121. The conductors 121 and 122 are arranged in the order of the first conductor 121, the second conductor 122, and the first conductor 121 in the ascending and descending direction of the car 1 and continuously without a gap therebetween. Moreover, the conductors 121 and 122 generate an eddy current when an AC magnetic field acts from the outside.

On the other hand, the sensor 130 includes an excitation/magnetic field detector 131, an AC power supply 132 of a frequency f, and a signal processing part 138. The excitation/magnetic field detector 131 includes a detection coil 131A, which is an example of a magnetic field detector, an excitation coil 131B, which is an example of a magnetic field generator, and one coil bobbin 131C made of a non-magnetic material.

The detection coil 131A and the excitation coil 131B are wound and held on the coil bobbin 131C. The coil bobbin 131C extends in a direction orthogonal to the identification plate 120. Moreover, the detection coil 131A is arranged closer to the identification plate 120 than the excitation coil 131B. Further, the excitation coil 131B is electrically connected to the AC power supply 132.

The signal processing part 138 includes an AC magnetic field component removal circuit 133, a phase difference detection circuit 134, an amplitude value detection circuit 135, an amplitude value comparator 136, and a phase difference comparator 137.

The phase difference detection circuit 134 and the amplitude value detection circuit 135 are electrically connected to the AC magnetic field component removal circuit 133. The phase difference detection circuit 134 is electrically connected to the phase difference comparator 137. The amplitude value detection circuit 135 is electrically connected to the amplitude value comparator 136.

A description is now given of an interaction between the identification plate 120 and each of the detection coil 131A and the excitation coil 131B. In general, it is known that when an AC magnetic field is applied to a conductor, an eddy current flows from a conductor surface to an inside. A magnitude of the eddy current exponentially decreases as the distance from the conductor surface to the inside increases. Moreover, the phase of the eddy current lags in proportion to the depth from the conductor surface.

A depth at which the magnitude of the eddy current is 1/e with respect to the eddy current on the conductor surface (a depth at which the phase of the eddy current lags by 1 rad with respect to the eddy current on the conductor surface) is referred to as "skin depth δ". The skin depth δ can be represented by $\delta = 1/\sqrt{(\pi f \mu \sigma)}$ by using a frequency f of the AC magnetic field to be applied, a magnetic permeability μ, and a conductivity σ. Then, an eddy current magnetic field observed outside the conductor is a sum of all excited magnetic fields generated from the eddy currents flowing at respective depths inside the conductor.

Figure 3:
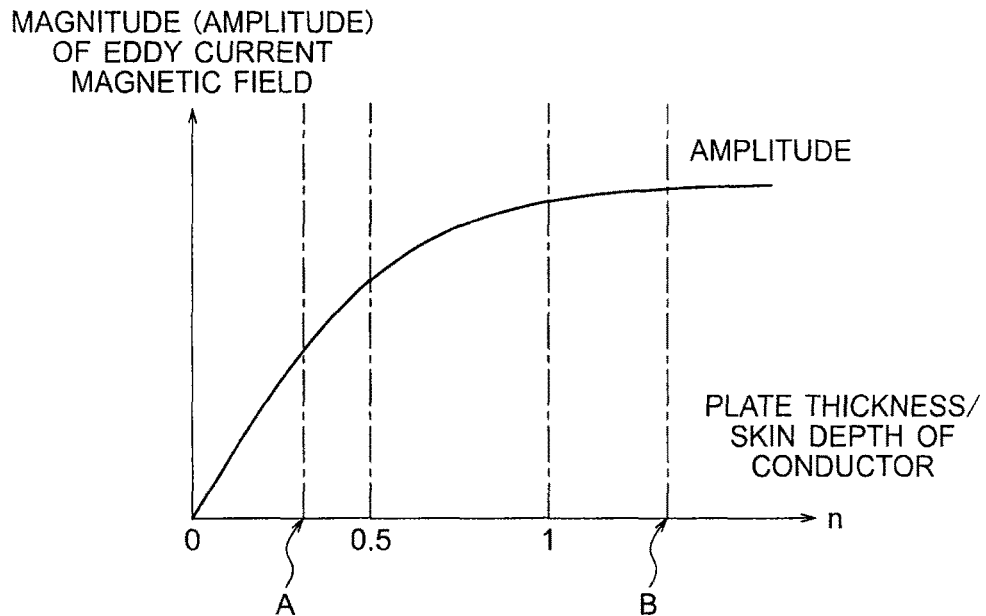
FIG. 3 is a graph showing an example of a relationship between a magnitude (amplitude) of an eddy current magnetic field and a ratio of a plate thickness to a skin depth of a conductor at the time when an AC magnetic field is applied to the conductor.
Figure 4:
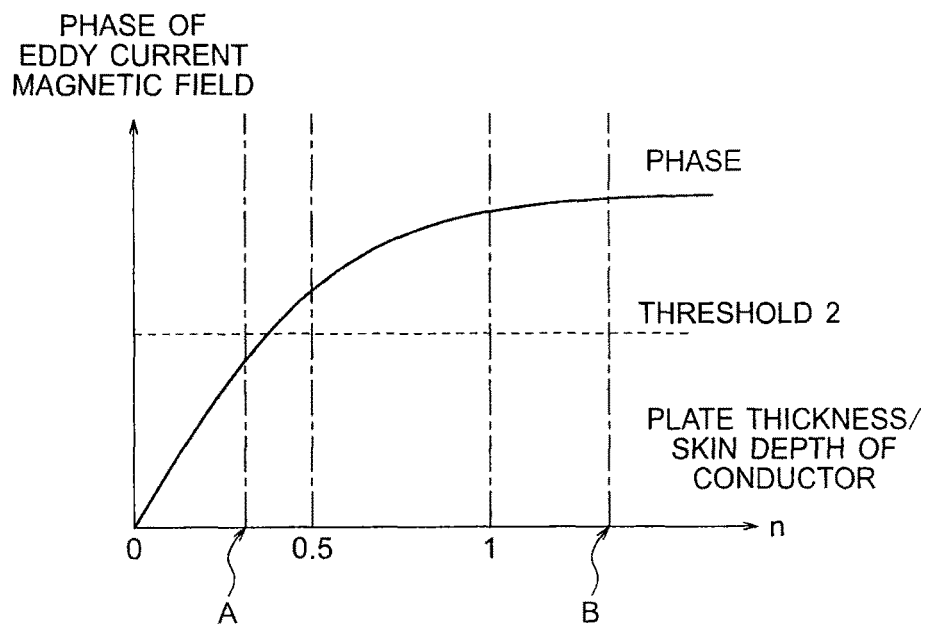
FIG. 4 is a graph showing an example of a relationship between a phase of the eddy current magnetic field and the ratio of the plate thickness to the skin depth of the conductor at the time when the AC magnetic field is applied to the conductor.

FIG. 3 is a graph showing a relationship between the magnitude (amplitude) of the eddy current magnetic field and a ratio of a plate thickness d to the skin depth δ of the conductor at the time when the AC magnetic field is applied to the conductor, and FIG. 4 is a graph showing a relationship between the phase of the eddy current magnetic field and the ratio of the plate thickness d to the skin depth δ of the conductor at the time when the AC magnetic field is applied to the conductor. In FIG. 3, the horizontal axis represents the ratio n (=d/δ) of the thickness d of the conductor with respect to the skin depth δ, and the vertical axis represents the magnitude (amplitude) of the eddy current magnetic field. Moreover, in FIG. 4, the horizontal axis represents the ratio n, and the vertical axis represents the phase of the eddy current magnetic field.

It is understood from FIGS. 3 and 4 that both the amplitude and the phase of the eddy current monotonically increase while n<1, and present a tendency of converging to a certain value while n>1. In detail, the amplitude value and the phase of the eddy current magnetic field present a relationship, "those without a conductor"<"those when the skin depth of the eddy current is large with respect to the plate thickness of the conductor"<"those when the skin depth of the eddy current is small with respect to the plate thickness of the conductor".

A positional relationship between the identification plate 120 and each of the detection coil 131A and the excitation coil 131B can be known by detecting the amplitude value and the phase of the eddy current magnetic field based on this relationship.

When the AC magnetic field is applied to the conductor in this way, an eddy current corresponding to the skin depth and the plate thickness of the conductor is generated on the conductor, and, accordingly, an eddy current magnetic field is generated from the conductor. Therefore, by arranging a magnetic field detector (a magnetic sensor such as a coil, a Hall element, or a magnetic resistive element) for detecting the eddy current magnetic field and the AC magnetic field near the conductor, an amplitude value of only the eddy current magnetic field or a magnetic field acquired by combining the eddy current magnetic field and the AC magnetic field, and a change amount of the phase with respect to the AC magnetic field can be known from an output signal of the magnetic field detector.

When the above-mentioned theory is applied to the identification plate 120, the detection coil 131A, and the excitation coil 131B, the following description can be given. In other words, by supplying an alternating current having a frequency f and a certain amplitude from the AC power supply 132 to the excitation coil 131B, an AC magnetic field of the frequency f is generated around the excitation coil 131B. Then, an AC magnetic field generated by the excitation coil 131B can be detected by the detection coil 131A arranged coaxially with the excitation coil 131B. Therefore, when a conductor does not exist in a neighborhood of the excitation coil 131B and the detection coil 131A, the output of the detection coil 131A is only an AC signal having the frequency f and a certain amplitude.

On the other hand, a case in which the excitation coil 131B is opposed to the first and second conductors 121 and 122 is now considered. In this case, the AC magnetic field having the frequency f generated from the excitation coil 131B is applied to the conductors 121 and 122. Therefore, eddy currents are generated inside the conductors 121 and 122, and an eddy current magnetic field is generated from the conductors 121 and 122. As a result, an output voltage of the detection coil 131A has a waveform of not only an AC magnetic field component from the excitation coil 131B, but a composite waveform of the AC magnetic field component and the eddy current magnetic field component from the conductors 121 and 122.

A description is now given of the signal processing part 138. The AC magnetic field component removal circuit 133 extracts only the eddy current magnetic field component out of the voltage waveform output from the detection coil 131A, and outputs a voltage V1 of the eddy current magnetic field component. The AC magnetic field component removal circuit 133 can include, for example, a delay circuit and a differential amplifier, or a Wheatstone bridge circuit.

The amplitude value detection circuit 135 detects an amplitude voltage V2 from the voltage waveform V1 from the AC magnetic field component removal circuit 133, and outputs the amplitude voltage V2 to the amplitude value comparator 136. The amplitude value comparator 136 determines whether or not the amplitude voltage V2 is equal to or more than a threshold. When the amplitude voltage V2 is equal to or more than the threshold, in other words, the identification plate 120 is detected, the amplitude value comparator 136 sets a voltage V4 to High(1), and outputs the voltage V4.

On the other hand, when the amplitude voltage V2 is less than the threshold, in other words, the identification plate 120 is not detected, the amplitude value comparator 136 sets the voltage V4 to Low(0), and outputs the voltage V4. Whether or not the detection coil 131A and the excitation coil 131B are opposed to the identification plate 120, namely, the conductors 121 and 122, can be determined in this way.

Moreover, the voltage waveform V1 output from the AC magnetic field component removal circuit 133 and the output current waveform of the excitation coil 131B are supplied to the phase difference detection circuit 134. Then, the phase difference detection circuit 134 detects a phase difference therebetween, and outputs the phase difference to the phase difference comparator 137.

The phase difference comparator 137 determines whether or not the phase difference detected by the phase difference detection circuit 134 is equal to or more than a threshold for the phase difference. When the phase difference is equal to or more than the threshold, in other words, the identification plate 120 is detected, the phase difference comparator 137 sets a voltage V5 to High (1), and outputs the voltage V5.

On the other hand, when the phase difference is less than the threshold, in other words, the identification plate 120 is not detected, the phase difference comparator 137 sets the voltage V5 to Low(0), and outputs the voltage V5. Whether or not the detection coil 131A and the excitation coil 131B are opposed to the conductor 121 or the conductor 122 of the identification plate 120 can be determined in this way.

As already described, in landing control for the car 1 on a certain floor, the door zone and the re-level zone need to be considered. In other words, it is desired that whether the sensor 130 is positioned in the door zone or the re-level zone be identified by using the identification plate 120.

Then, as shown on horizontal axes of FIGS. 3 and 4, the plate thickness d and the skin depth δ of the first conductor 121 are adjusted so that the ratio n of the thickness d of the conductor with respect to the skin depth δ is "A". Similarly, the plate thickness d and the skin depth δ of the second conductor 122 are adjusted so that the ratio n is "B".

Further, as illustrated in FIG. 2, the second conductor 122 is positioned in a region in which the re-level zone is to be detected, and the first conductors 121 are each positioned in a region in which the door zone other than the re-level zone is to be detected.

As an example, when the frequency of the AC magnetic field of the AC power supply 132 is 100 kHz, the first conductor 121 is made of non-magnetic stainless steel (SUS304) having a plate thickness of 0.5 mm (δ=1.4 mm), and the second conductor 122 is made of an aluminum alloy (A5052) having a plate thickness of 1 mm (δ=0.36 mm).

As described above, the amplitude value and the phase of the eddy current magnetic field increase as the skin depth of the eddy current with respect to the plate thickness of the conductor of the identification plate 120 decreases. Thus, in order to decrease the skin depth of the eddy current with respect to the plate thickness of the conductor, instead of increasing the plate thickness of the conductor, by changing the metal species of the conductor, in other words, by using a metal species different in the resistivity or the magnetic permeability so as to change the skin depth, the plate thickness of the identification plate 120 can be constant or decreased. As a result, the cost and the weight can be reduced, and an installation property of the identification plates 120 can be increased.

Figure 5:
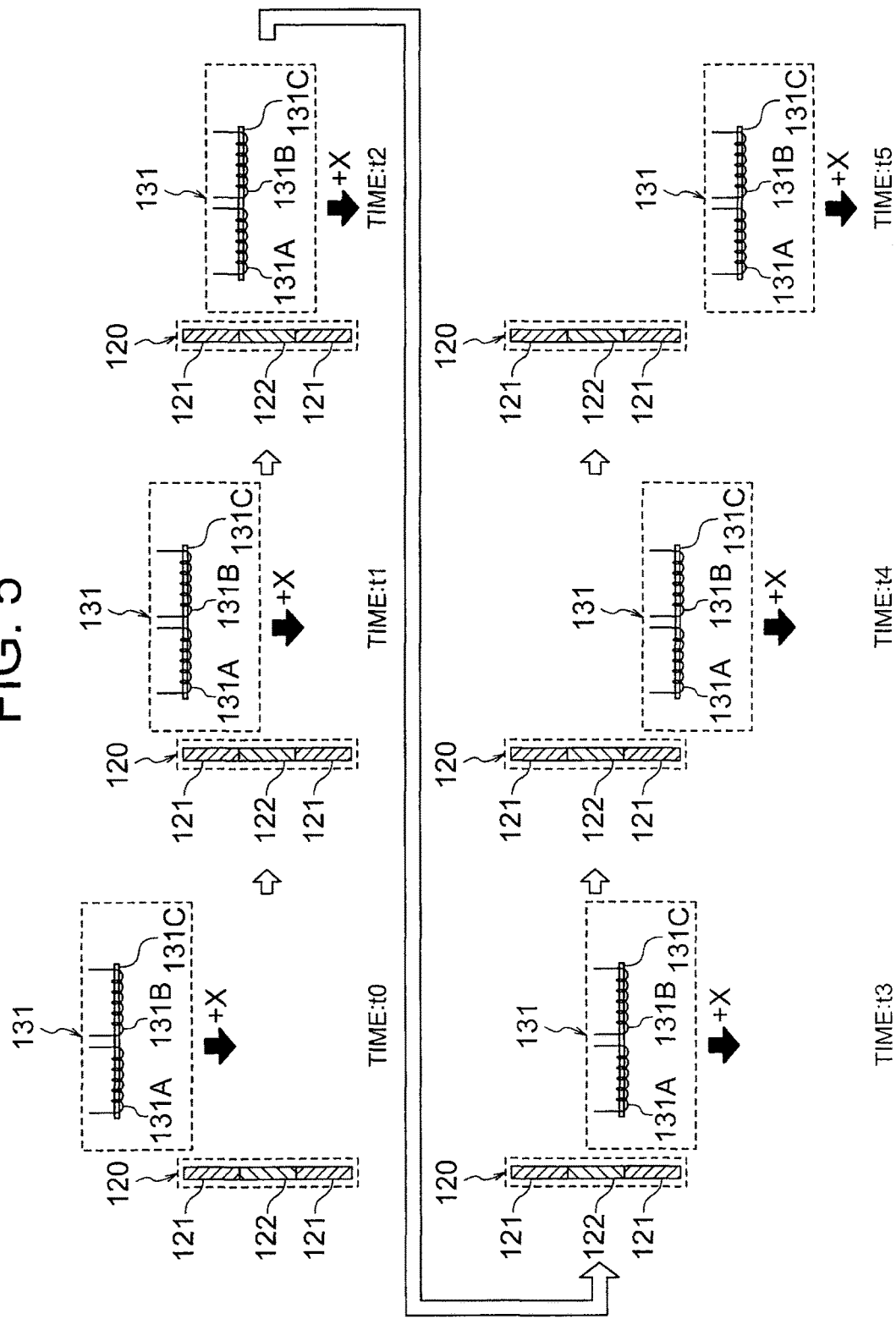
FIG. 5 is an explanatory diagram illustrating an example of a temporal change in a positional relationship between an identification plate and a sensor of FIG. 2.

A description is now given of an operation of the car position detection device 101. On this occasion, referring to FIG. 5, a description is given of a case in which the sensor 130 moves in a direction from an outside of a range of the identification plate 120 toward the identification plate 120, for example, in a +X direction of FIG. 2. FIG. 5 is an explanatory diagram illustrating a change in a positional relationship between the identification plate 120 and the sensor 130 of FIG. 2 when the time elapses from t0 to t5.

In FIG. 5, the detection coil 131A and the excitation coil 131B are opposed to the conductors 121 and 122 in the identification plate 120 in the order of the first conductor 121 from (t1 to t2)→the second conductor 122 (from t2 to t3)→the first conductor 121 (from t3 to t4).

Figure 6:
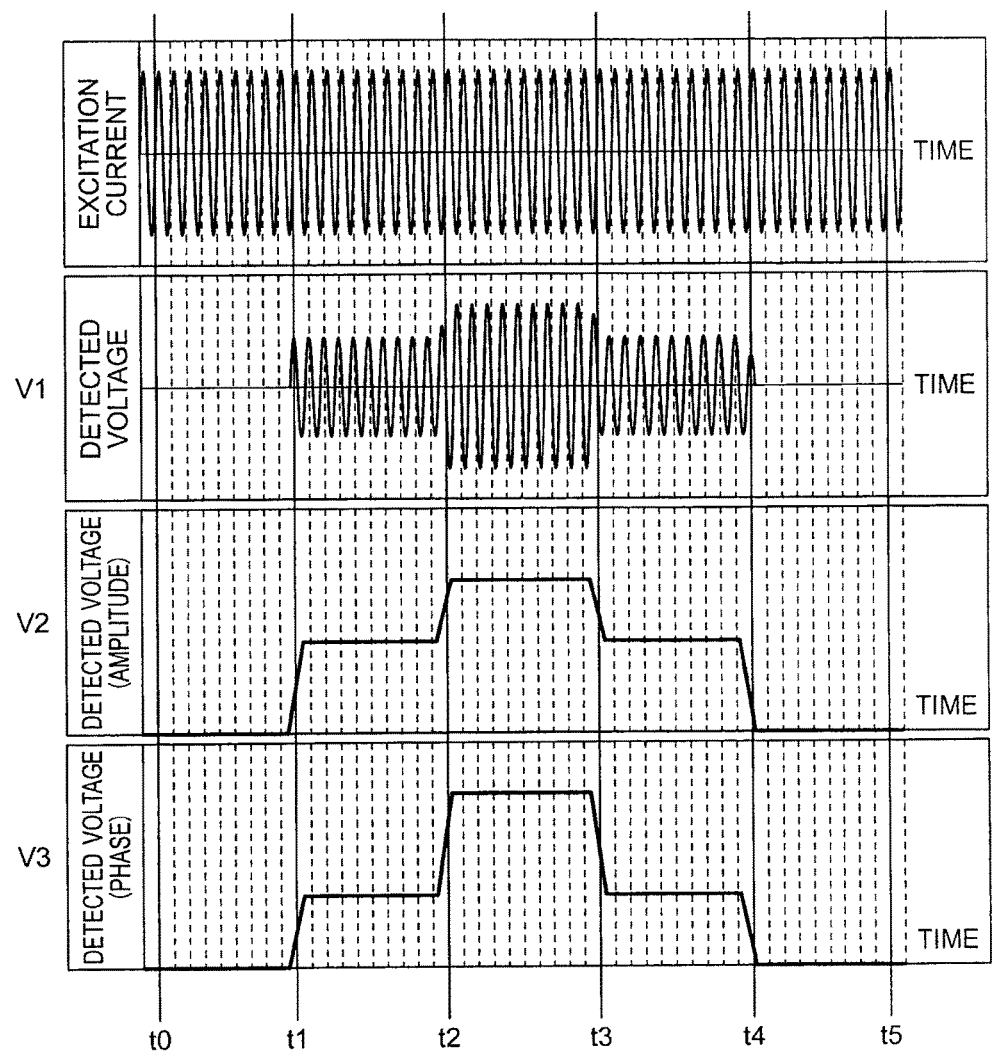
FIG. 6 is a graph showing changes in an excitation current, an output V1 of an AC magnetic field component removal circuit, an output V2 of an amplitude value detection circuit, and an output V3 of a phase difference detection circuit from a time point t0 to a time point t5 of FIG. 5.

FIG. 6 is a graph showing changes in an excitation current, the output V1 of the AC magnetic field component removal circuit 133, the output V2 of the amplitude value detection circuit 135, and the output V3 of the phase difference detection circuit 134 from the time point t0 to the time point t5 of FIG. 5. As apparent from FIG. 6, the values of the outputs V2 and V3 increase and decrease from the time point t1 to the time point t4.

Figure 7:
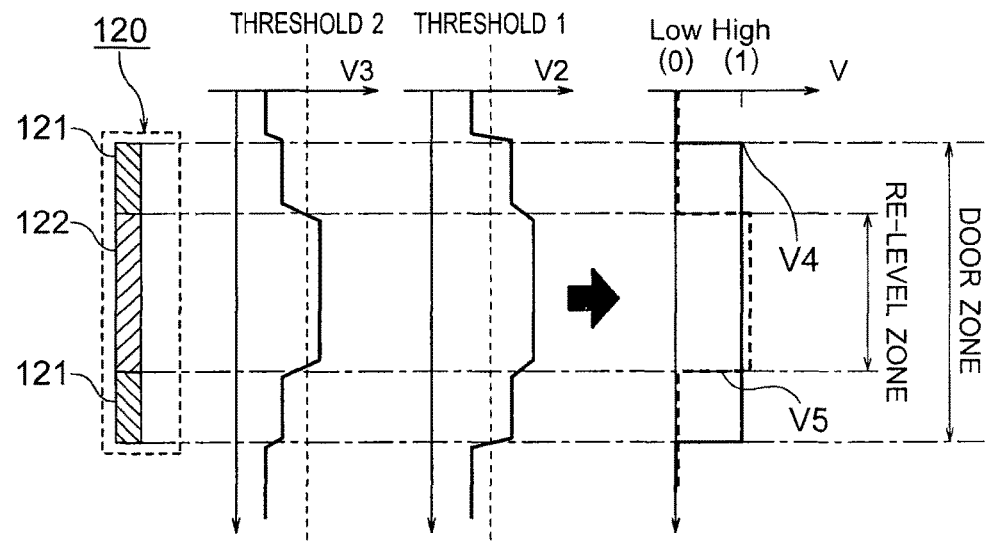
FIG. 7 is an explanatory diagram illustrating a relationship between a position of an excitation/magnetic field detector with respect to the identification plate of FIG. 5 and voltages V2, V3, V4, and V5.

FIG. 7 is an explanatory diagram illustrating a relationship between the position of the excitation/magnetic field detector 131 with respect to the identification plate 120 of FIG. 5 and the voltages V2, V3, V4, and V5. In FIG. 7, thresholds 1 and 2 are reference voltages for operating the comparators 136 and 137, and, by properly setting values thereof, signals V4 and V5 at High(1) and Low(0) corresponding to the door zone and the re-level zone can be independently output from the sensor 130.

On this occasion, a description is given of how to set the thresholds 1 and 2 for the respective comparators 136 and 137. In general, the car 1 of the elevator is raised and lowered along a guide rail installed on the hoistway 3, but may swing in a certain range in a direction orthogonal to the ascending and descending direction. Therefore, the gap between the identification plate 120 installed on the hoistway 3 and the sensor 130 installed on the car 1 varies.

Figure 8:
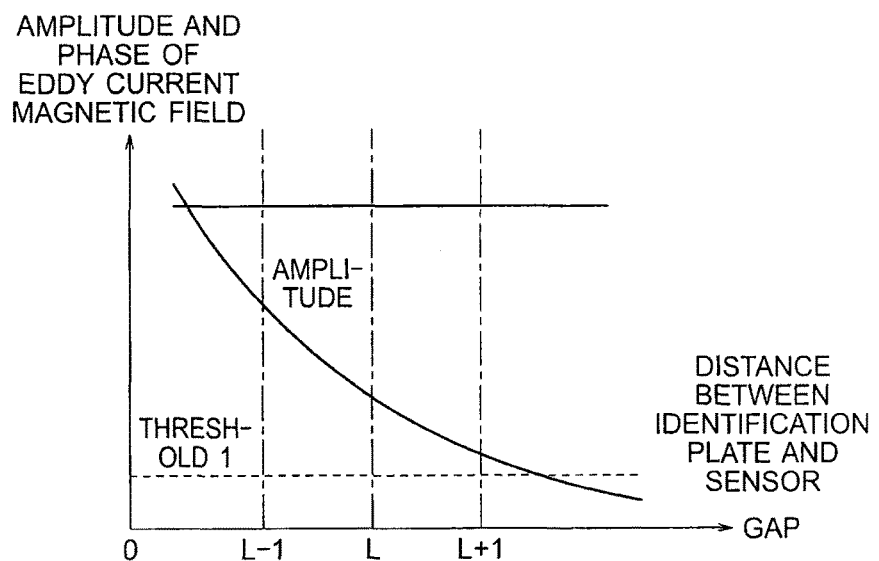
FIG. 8 is a graph showing an example of a relationship between a gap between the identification plate and the excitation/magnetic field detector of FIG. 2 and the magnitude (amplitude) and the phase of the eddy current magnetic field.

FIG. 8 is a graph showing the gap between the identification plate 120 and the excitation/magnetic field detector 131 of FIG. 2 and the magnitude (amplitude) and the phase of the eddy current magnetic field, in which a center position in the variation of the gap is set to L, and a variation width is set to "1".

When the gap increases, distances between each of the conductors 121 and 122 and each of the detection coil 131A and the excitation coil 131B increase, and the eddy current magnetic field received by the detection coil 131A decreases. Therefore, as shown in FIG. 8, when the gap increases, the amplitude of the eddy current magnetic field monotonically decreases.

On the other hand, the detection coil 131A detects the eddy current magnetic field that is the sum of the excitation magnetic fields generated by the eddy currents flowing through the conductors 121 and 122. Therefore, when the plate thicknesses of the conductors 121 and 122 with respect to the gap value are sufficiently small, even when the gap varies, the phase itself of the eddy current magnetic field does not vary.

Thus, the threshold 1 for the amplitude value comparator 136 for determining the door zone only needs to be set so that the amplitude of the eddy current magnetic field when the gap is increased is equal to or more than the threshold, and only needs to be set to a value represented by the dotted line of FIG. 8.

Then, the phase difference itself of the eddy current does not change even when the gap varies. Therefore, as shown in FIG. 4, the threshold 2 for the phase difference comparator 137 for determining the re-level zone only needs to be set between the first conductor 121 (position A) and the second conductor 122 (position B).

Note that, in this embodiment, as illustrated in FIG. 2, the second conductor 122 is used for detecting the re-level zone, but the first conductor 121 and the second conductor 122 may be replaced with each other, and the first conductor 121 may be used for detecting the re-level zone.

Figure 9:
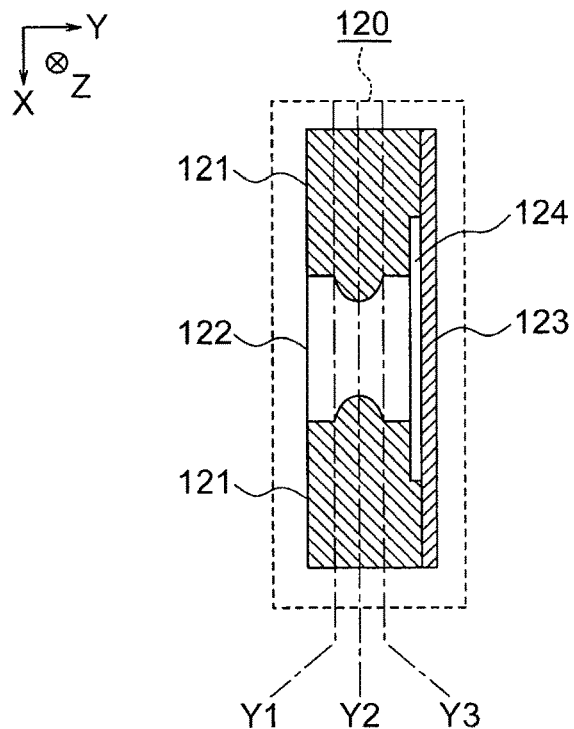
FIG. 9 is a front view illustrating details of the identification plate of FIG. 2.

A detailed description is now given of the first and second conductors 121 and 122 in the identification plate 120. FIG. 9 is a front view illustrating details of the identification plate 120 of FIG. 2. A mounting part 123 for fixing the identification plate 120 to the hoistway 3 is formed on an end of the identification plate 120 in the orthogonal direction to the ascending and descending direction of the car 1. In FIG. 9, an X axis is in the ascending and descending direction of the car 1, a Y axis is in the direction (horizontal direction) orthogonal to the ascending and descending direction of the car 1, a Z axis is in a plate thickness direction of the conductors 121 and 122, and a lateral swing in the Y axis direction occurs on the car 1.

The center of the excitation/magnetic field detector 131 is displaced with respect to the identification plate 120 in a range of from Y1 to Y3 by the swing of the car 1 in the Y axis direction. Moreover, when the car 1 is positioned at a center of the range of the lateral swing, the center of the excitation/magnetic field detector 131 is positioned at Y2 with respect to the identification plate 120.

The boundary between the first conductor 121 and the second conductor 122 draws a curve, in this example, a second-order curve, in the range of the displacement of the center of the excitation/magnetic field detector 131 with respect to the identification plate 120 by the lateral swing of the car 1. Moreover, the second-order curve of the boundary protrudes in the ascending and descending direction of the car 1, and, in this example, is a curve in which the first conductor 121 protrudes toward the second conductor 122. Further, the second-order curve at the boundary protrudes most toward the second conductor 122 side at the center Y2 of the displacement of the excitation/magnetic field detector 131 with respect to the identification plate 120.

Further, a protruded amount toward the second conductor 122 side of the second-order curve of the boundary gradually decreases as a displacement amount from the displacement center Y2 increases. In other words, the protruding part of the boundary is bilaterally symmetrical about the displacement center Y2.

This boundary shape maintains the generation amount of the eddy current from the second conductor 122 to be constant even when the excitation/magnetic field detector 131 is displaced in the Y axis direction with respect to the identification plate 120.

Moreover, a slit 124 (a portion absent in the first and second conductors 121 and 122) is formed on the end (at a part adjacent to the mounting part 123) on the mounting part 123 side in the widthwise direction of the identification plate 120. The slit 124 is formed from the first conductor 121 on the upper side via the second conductor 122 to the first conductor 121 on the lower side. Moreover, a dimension of the slit 124 in the Y axis direction is sufficiently smaller than a dimension of the slit 124 in the X axis direction. An eddy current interference between the identification plate 120 and the mounting part 123 is eliminated by the slit 124.

Figure 10:
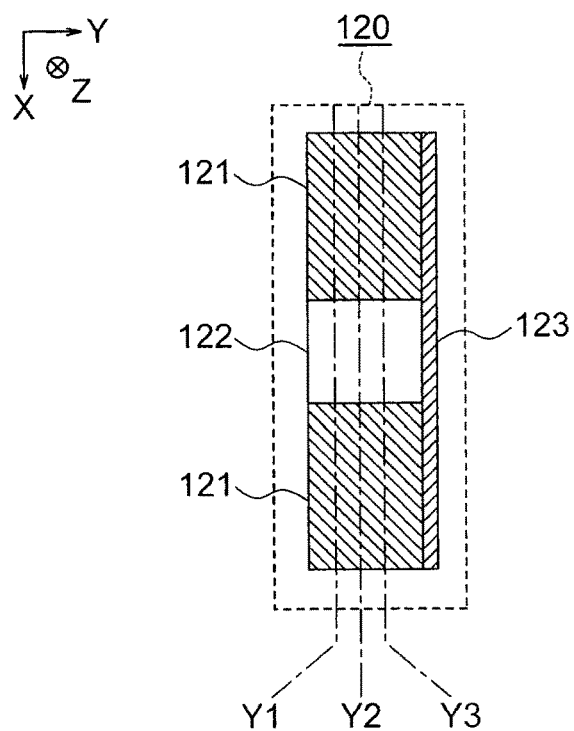
FIG. 10 is a front view illustrating a comparative example in which boundaries between first conductors and a second conductor of FIG. 9 are straight lines orthogonal to an ascending and descending direction.
Figure 11:
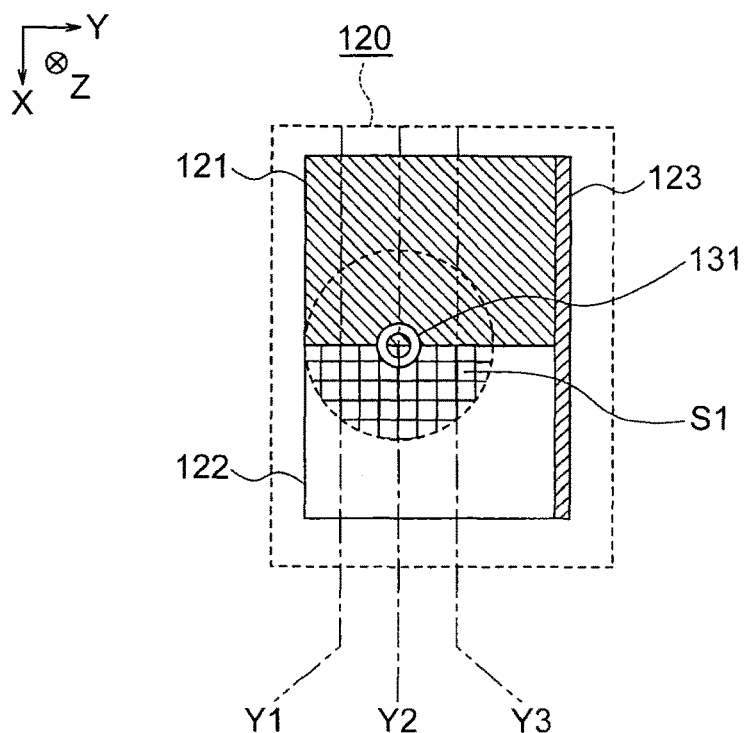
FIG. 11 is a front view illustrating the boundary of FIG. 10 in an enlarged scale.
Figure 12:
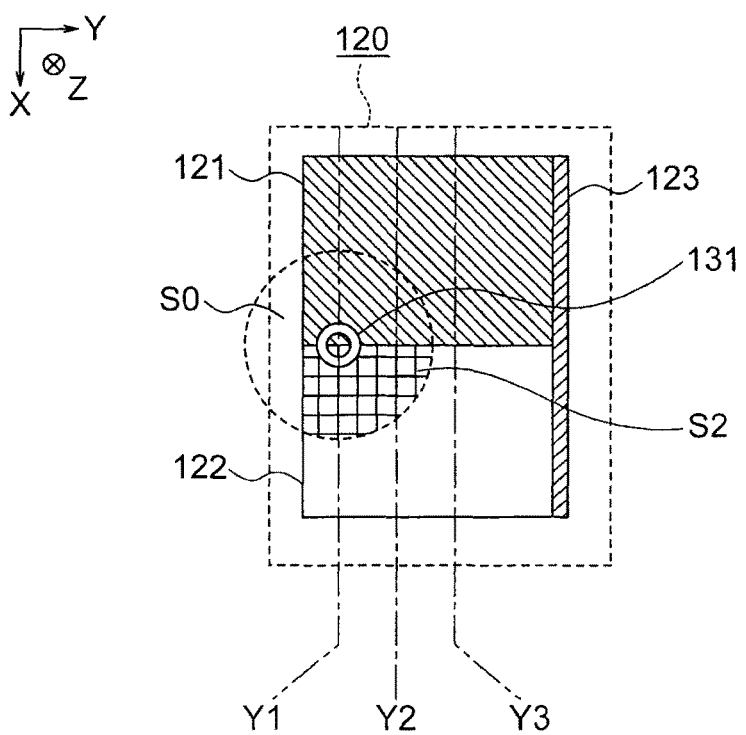
FIG. 12 is a front view illustrating a state in which a center of the excitation/magnetic field detector of FIG. 11 is displaced to Y1.

A detailed description is now given of a reason for constructing the identification plate 120 as illustrated in FIG. 9. FIG. 10 is a front view illustrating a comparative example in which the boundaries between the first conductors 121 and the second conductor 122 of FIG. 9 are straight lines orthogonal to the ascending and descending direction of the car 1. FIG. 11 is a front view illustrating the boundary of FIG. 10 in an enlarged scale, and illustrating a state in which the center of the excitation/magnetic field detector 131 is positioned on the displacement center Y2 on the boundary between the first and second conductors 121 and 122. FIG. 12 is a front view illustrating a state in which the center of the excitation/magnetic field detector 131 of FIG. 11 is displaced to Y1.

As illustrated in FIG. 11, when the center of the excitation/magnetic field detector 131 is positioned on the boundary between the first and second conductors 121 and 122, and the car 1 is positioned at the center of the swing, a region of the eddy current generated by the second conductor 122 is a semicircular region S1.

In contrast, when the car 1 is greatly displaced in the horizontal direction, and the center of the excitation/magnetic field detector 131 is positioned at Y1, as illustrated in FIG. 12, a region S0 where the eddy current is not generated is generated. As a result, the region in which the eddy current is generated from the second conductor 122 is a region S2 in a semicircular shape having a missing part, and is thus smaller than the region S1 when the center of the excitation/magnetic field detector 131 is positioned at the displacement center Y2.

Figure 13:
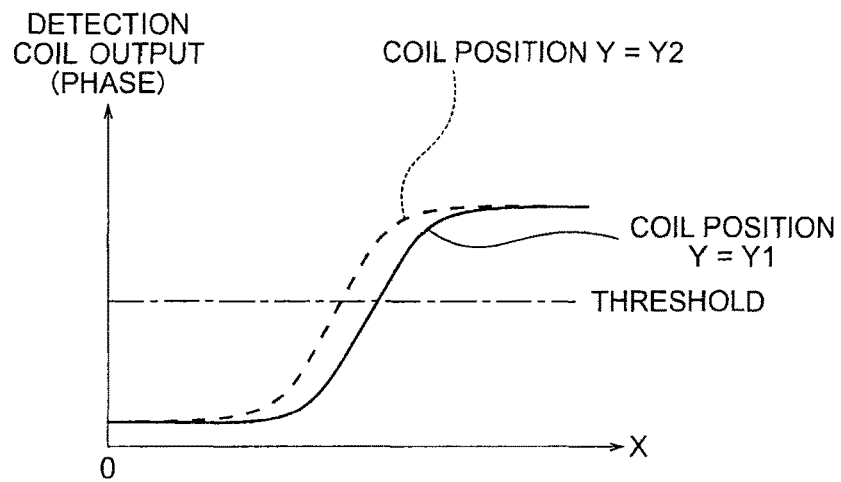
FIG. 13 is a graph showing an example of change waveforms of an output of a detection coil when the center of the excitation/magnetic field detector of FIG. 11 moves in an X axis direction along Y1 and when the center moves along Y2.

FIG. 13 is a graph showing an example of change waveforms of the output (phase) of the detection coil 131A when the center of the excitation/magnetic field detector 131 of FIG. 11 moves in the X axis direction along Y1 and when the center moves along Y2. As shown in FIG. 13, when the position of the detection coil 131A is displaced in the Y axis direction, a shift is generated in the detected position of the second conductor 122 by means of the comparison based on the threshold.

Figure 14:
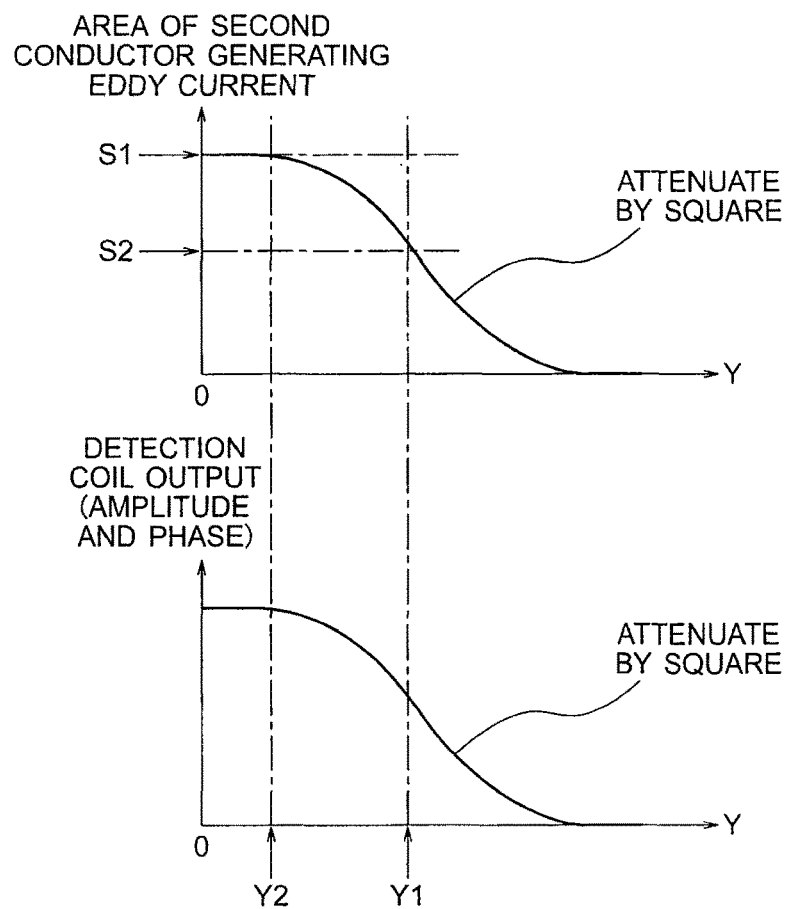
FIG. 14 is a graph showing a relationship between a position in a Y axis direction of the excitation/magnetic field detector of FIG. 11 and each of an area in which an eddy current is generated on the second conductor and the output from the detection coil.

FIG. 14 is a graph showing a relationship between the position in the Y axis direction of the excitation/magnetic field detector 131 of FIG. 11 and each of the area in which the eddy current is generated on the second conductor 122 and the output (amplitude and phase) from the detection coil 131A. As shown in FIG. 14, as the movement amount in the Y axis direction of the excitation/magnetic field detector 131 increases, the area in which the eddy current is generated on the second conductor 122 decreases by the square of the movement amount. As a result, the output from the detection coil 131A also attenuates by the square of the movement amount.

Figure 15:
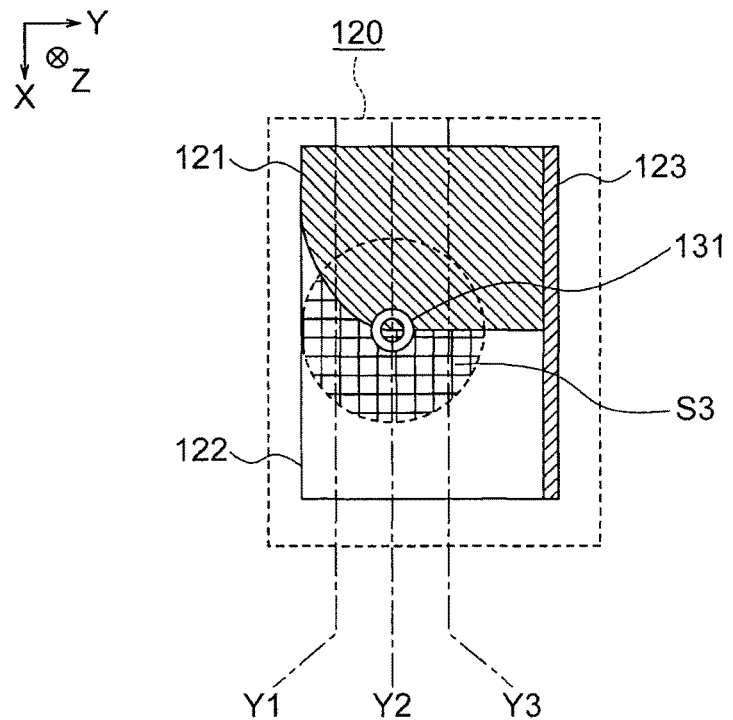
FIG. 15 is a front view illustrating an example in which the boundary between the first and second conductors of FIG. 11 is a second-order curve.
Figure 16:
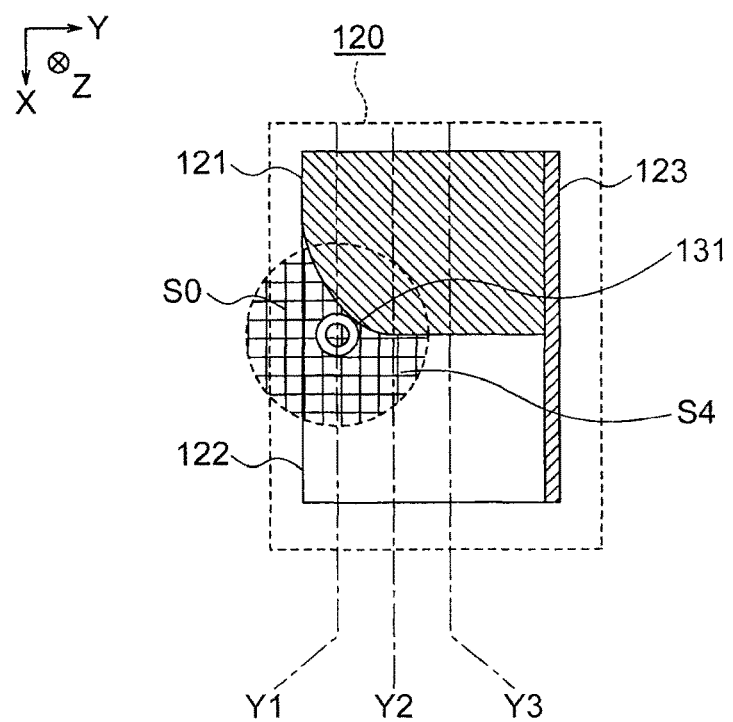
FIG. 16 is a front view illustrating a state in which the center of the excitation/magnetic field detector of FIG. 15 is displaced to Y1.

FIG. 15 is a front view illustrating an example in which the boundary between the first and second conductors 121 and 122 of FIG. 11 is a second-order curve, and FIG. 16 is a front view illustrating a state in which the center of the excitation/magnetic field detector 131 of FIG. 15 is displaced to Y1.

When the boundary is arranged as the second-order curve in this way, a region S3 (FIG. 15) of the eddy current generated from the second conductor 122 when the center of the excitation/magnetic field detector 131 is positioned at the displacement center Y2 and a region S4 (FIG. 16) of the eddy current generated from the second conductor 122 when the center of the excitation/magnetic field detector 131 is positioned at Y1 are equal to each other. As a result, the variation in the output (amplitude and phase) from the detection coil 131A caused by the position change in the Y axis direction is eliminated.

Figure 17:
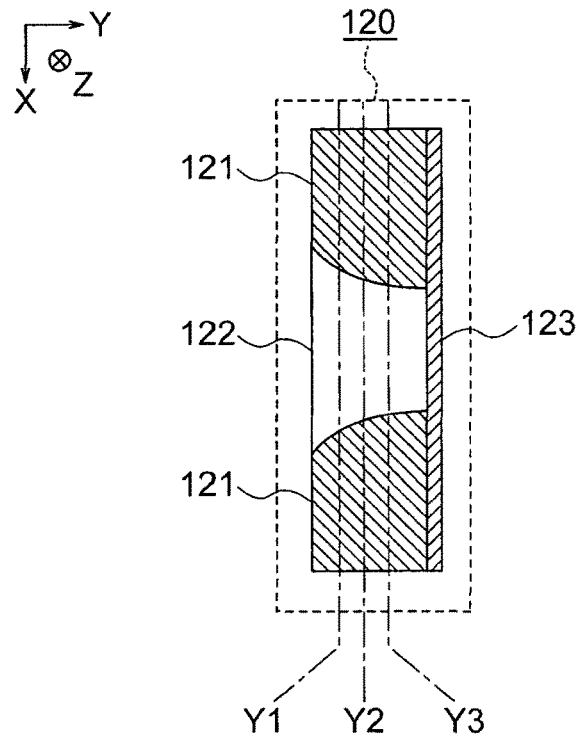
FIG. 17 is a front view illustrating a first modified example of the identification plate of the first embodiment.

FIG. 17 is a front view illustrating an example in which the boundaries between the first and second conductors 121 and 122 of FIG. 10 are second-order curves (first modified example of the identification plate 120 of the first embodiment), and the configuration of FIG. 17 is acquired by applying the boundary illustrated in FIGS. 15 and 16 to the entire identification plate 120.

Figure 18:
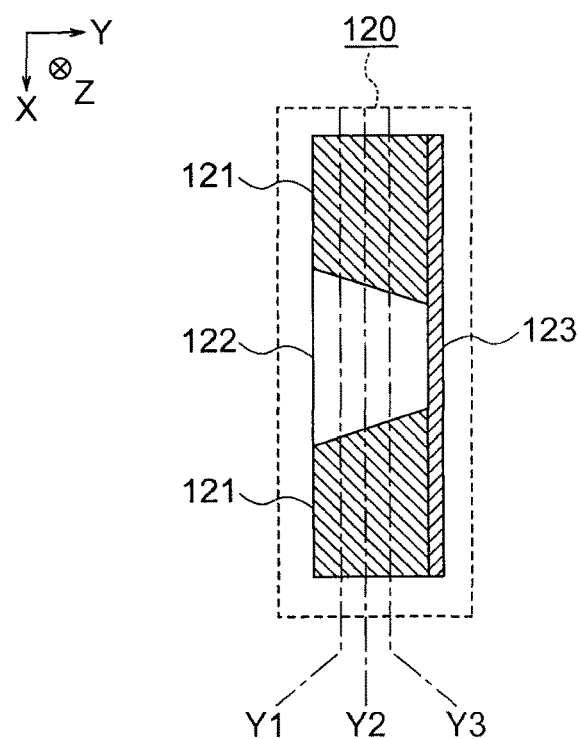
FIG. 18 is a front view illustrating a second modified example of the identification plate of the first embodiment.

Note that, when the position precision is not necessary as much as in the configuration of FIG. 17, as illustrated in FIG. 18 (second modified example of the identification plate 120 of the first embodiment), the second-order curves may be approximated by straight lines tilted with respect to the Y axis direction.

Figure 19:
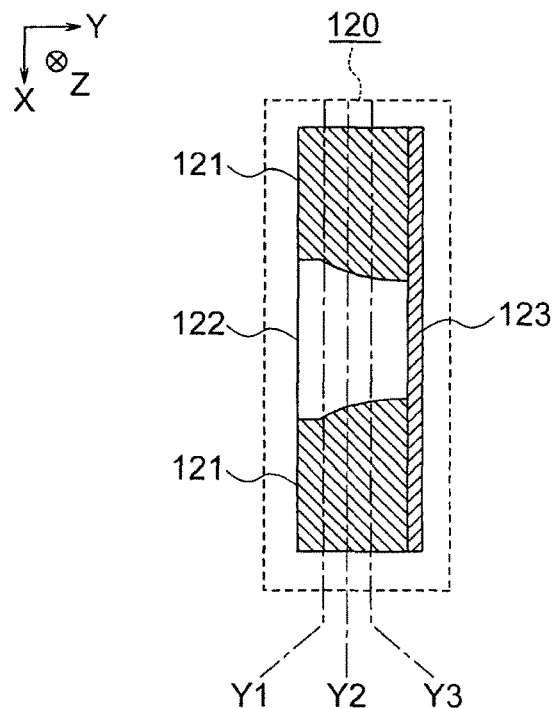
FIG. 19 is a front view illustrating a third modified example of the identification plate of the first embodiment.
Figure 20:
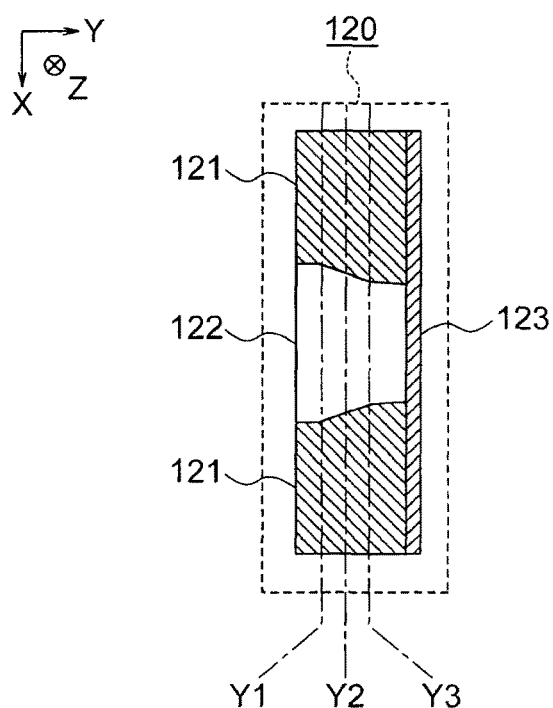
FIG. 20 is a front view illustrating a fourth modified example of the identification plate of the first embodiment.

Moreover, FIG. 19 is a front view illustrating an example in which the boundaries other than those in a range of from Y1 to Y3 of the identification plate 120 of FIG. 17 are parallel (horizontal) with the Y axis direction (third modified example of the identification plate 120 of the first embodiment), and FIG. 20 is a front view illustrating an example in which the boundaries other than those in a range of from Y1 to Y3 of the identification plate 120 of FIG. 18 are parallel (horizontal) with the Y axis direction (fourth modified example of the identification plate 120 of the first embodiment).

Figure 21:
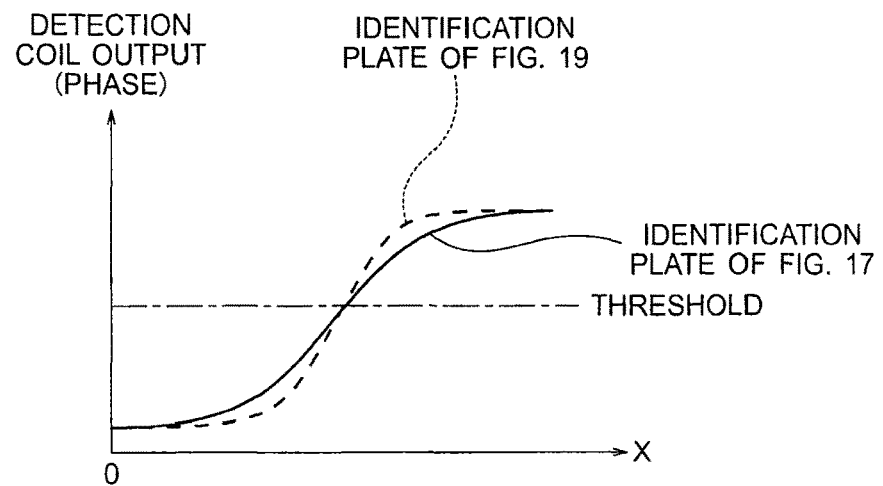
FIG. 21 is a graph showing an example of the change waveforms of the output of the detection coil at the time when the excitation/magnetic field detector moves in the X axis direction with respect to the identification plate of FIGS. 17 and 19.

As shown in FIG. 21, when the boundaries other than those in the range of from Y1 to Y3 are parallel with the Y axis direction, a rise of the output (phase) becomes steeper when the excitation/magnetic field detector 131 is moved in the X axis direction, resulting in an increase in a comparison precision based on the threshold.

Moreover, when a distance from Y3 to the mounting part 123 is short, an eddy current is generated also from the mounting part 123, which causes a position shift. Therefore, in the identification plate 120 of FIG. 9, the slit 124 formed in the portion adjacent to the mounting part 123 of the identification plate 120 prevents the eddy current in the conductors 121 and 122 and the eddy current in the mounting part 123 from being unified. This principle is the same as such a principle that steel plates are stacked and used in a yoke of a motor or a yoke of a transformer.

If this slit 124 is formed, when the excitation/magnetic field detector 131 is moved in the Y axis direction with respect to the identification plate 120 by the swing of the car 1, the region S0 in which the eddy current is not generated is generated. Therefore, the boundaries between the first and second conductors 121 and 122 are formed into the shapes symmetrical in the X axis direction about the displacement center Y2. As a result, even when the car 1 swings in the Y axis direction, the detection position is not shifted.

Figure 22:
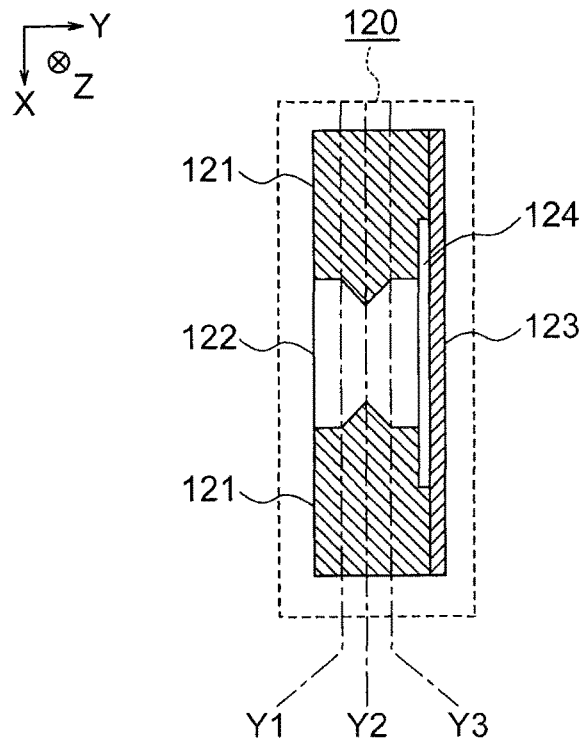
FIG. 22 is a front view illustrating a fifth modified example of the identification plate of the first embodiment.

FIG. 22 is a front view illustrating a fifth modified example of the identification plate 120 of the first embodiment. In this example, the second-order curve on the boundary between the first and second conductors 121 and 122 of FIG. 9 is approximated by two straight lines. When the position precision is not necessary as much as in the configuration in FIG. 9, the boundary shape may be set in this way, which facilitates manufacturing.

As described above, the car position detection device 101 of this embodiment can use the single detection coil 131A, the phase difference detection circuit 134, and the amplitude value detection circuit 135 to extract the two different detection signals of the phase and the amplitude from the detection coil 131A, thereby independently detecting the door zone and the re-level zone by the first conductors 121 and the second conductor 122 of the identification plate 120, respectively.

Moreover, the influence of the variation in the detection signal can be reduced by dividing the detection signal from the detection coil 131A based on the plurality of thresholds. Further, the single detection coil 131A detects the identification plate 120, resulting in a reduction in the manufacturing cost.

Further, the shape of at least a part of the boundary between the conductors 121 and 122 adjacent to each other is set as a straight line or a curve tilted with respect to the direction orthogonal to the ascending and descending direction of the car 1. Thus, even when the position of the sensor 130 with respect to the identification plate 120 is shifted by the lateral swing of the car 1, the reduction in the eddy current magnetic field generated on the part adjacent to the boundary can be suppressed, and the shift in the detection position can be suppressed, resulting in an increase in the position detection precision.

Moreover, the shape of the region of the curve is an n-th (n≥1) order curve. Thus, the reduction in the eddy current magnetic field caused by the lateral swing of the car 1 can be suppressed more securely, and the position detection precision can further be increased.

Further, the boundary between the conductors 121 and 122 adjacent to each other includes a protruding region that protrudes in the ascending and descending direction of the car 1 at the intermediate part in the direction orthogonal to the ascending and descending direction of the car 1. Thus, the reduction in the eddy current magnetic field caused by the lateral swing of the car 1 can be more securely suppressed, resulting in a more increase in the position detection precision.

A description is now given of modified examples of the sensor 130 of the first embodiment.

Figure 23:
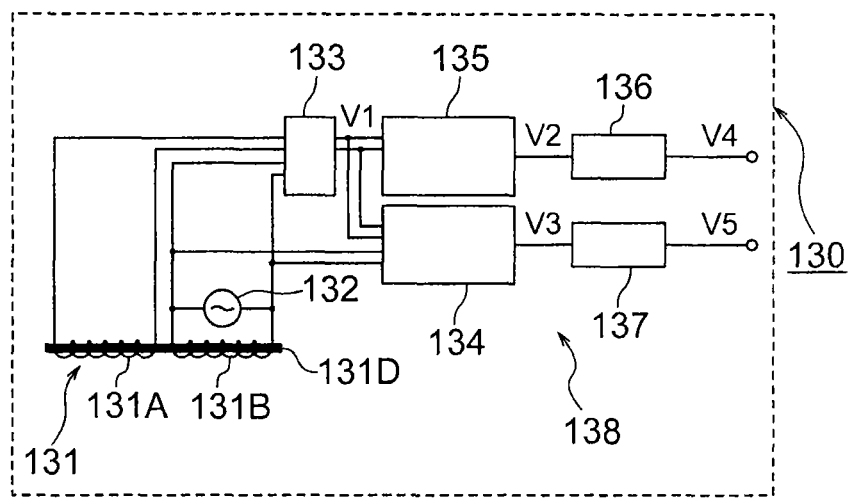
FIG. 23 is a configuration diagram illustrating a first modified example of the sensor of the first embodiment.

FIG. 23 is a configuration diagram illustrating a first modified example of the sensor 130 of the first embodiment. In this example, a core 131D made of a rod-shape magnetic material having a high magnetic permeability is inserted through insides of the detection coil 131A and the excitation coil 131B. As a result, the AC magnetic field from the excitation coil 131B can be intensified, and the detected magnetic field can be intensified.

Figure 24:
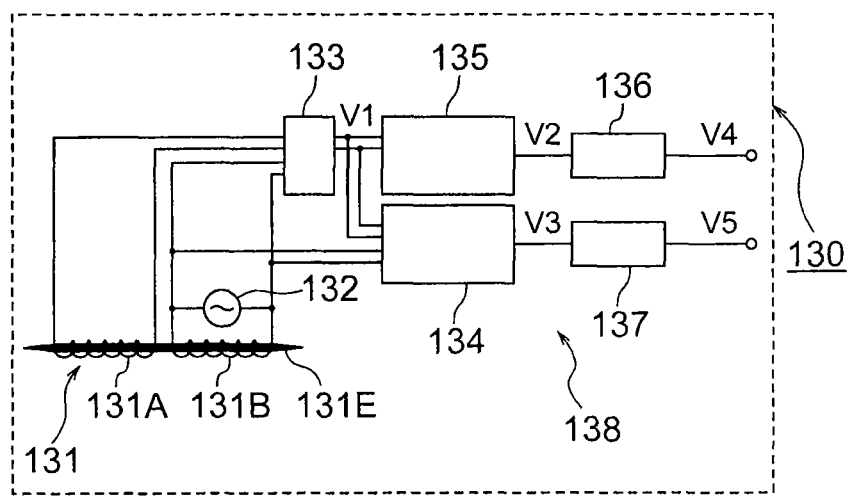
FIG. 24 is a configuration diagram illustrating a second modified example of the sensor of the first embodiment.

FIG. 24 is a configuration diagram illustrating a second modified example of the sensor 130 of the first embodiment. In this example, a core 131E made of a needle-shape magnetic material having sharpened both ends is inserted through insides of the detection coil 131A and the excitation coil 131B. The needle-shape magnetic material core 131E is made of the same material as that of the coil bobbin 131C or the rod-shape magnetic material core 131D. As a result, directivity and the position detection precision of the AC magnetic field can be increased.

Figure 25:
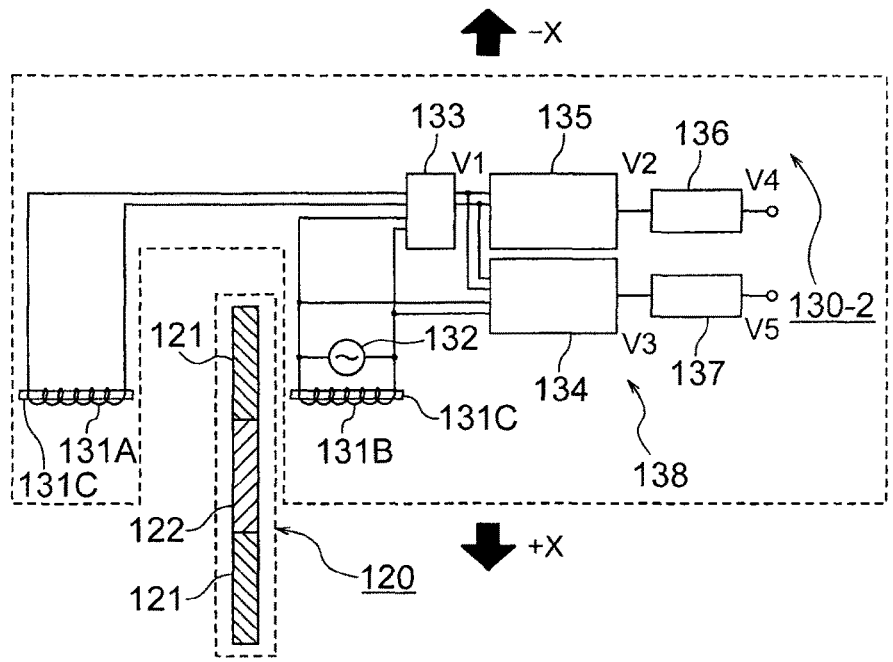
FIG. 25 is a configuration diagram illustrating a third modified example of the sensor of the first embodiment.

FIG. 25 is a configuration diagram illustrating a third modified example of the sensor 130 of the first embodiment. In this example, the coil bobbin 131C is divided into two parts including a part on which the detection coil 131A is wound and a part on which the excitation coil 131B is wound. Then, the detection coil 131A and the excitation coil 131B are separated from each other, and are arranged on both left and right sides of the identification plate 120. The detection coil 131A and the excitation coil 131B may not use the common coil bobbin 131C in this way.

Moreover, the two coil bobbins 131C of the third modified example may respectively be configured as the rod-shape magnetic material cores 131D of the first modified example or the needle-shape magnetic material cores 131E of the second modified example.

Figure 26:
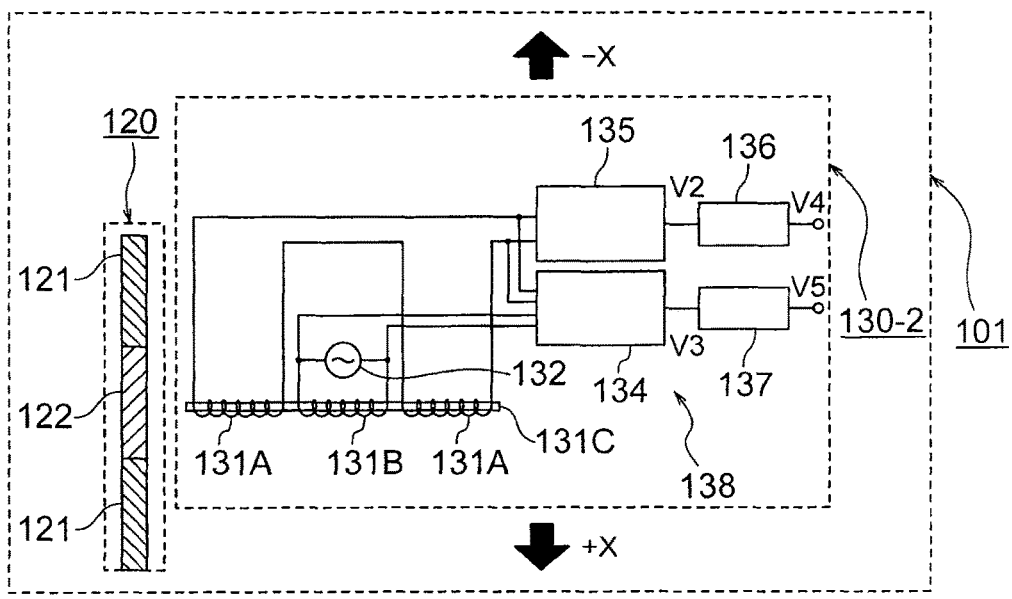
FIG. 26 is a configuration diagram illustrating a fourth modified example of the sensor of the first embodiment.

FIG. 26 is a configuration diagram illustrating a fourth modified example of the sensor 130 of the first embodiment. A sensor 130-2 of this example removes the AC magnetic field component from the output voltage of the detection coil 131A without using the AC magnetic field component removal circuit 133.

Specifically, the excitation/magnetic field detector of the sensor 130-2 includes two detection coils 131A. These detection coils 131A are arranged on both sides of the excitation coil 131B in the direction orthogonal to the ascending and descending direction, namely, a gap direction (horizontal direction) between the identification plate 120 and the excitation/magnetic field detector. Moreover, these detection coils 131A are arranged at positions at an equal distance from the excitation coil 131B. Thus, the AC magnetic fields of the same intensity are applied from the excitation coil 131B to the respective detection coils 131A.

Thus, the plate thickness of the identification plate 120 is set to be larger than a gap dimension between the identification plate 120 and the detection coil 131A so as to increase a gap variation in the phase of the eddy current magnetic field to a certain level. Then, the outputs of the respective detection coils 131A are used to form a differential output.

In this configuration, the AC magnetic field applied by the excitation coil 131B is the same at respective positions of the two detection coils 131A, but the eddy current magnetic field is different depending on the distance from the identification plate 120, and only the eddy current magnetic field component can be output from the detection coils 131A. As a result, the AC magnetic field component removal circuit 133 can be omitted, and the sensor cost can thus be further decreased.

Figure 27:
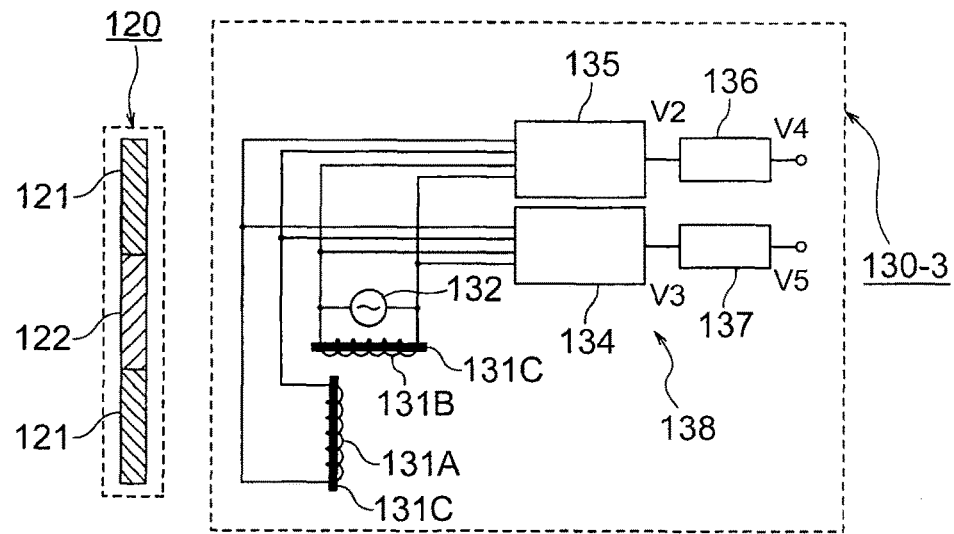
FIG. 27 is a configuration diagram illustrating a fifth modified example of the sensor of the first embodiment.

FIG. 27 is a configuration diagram illustrating a fifth modified example of the sensor 130 of the first embodiment. In a sensor 130-3 of this example, the coil bobbin 131C is divided into two parts, and the detection coil 131A and the excitation coil 131B are arranged so that the directions thereof are different from each other by 90 degrees. Specifically, the detection coil 131A is arranged so that an axis thereof is parallel with or approximately parallel with the identification plate 120. Then, the excitation coil 131B is arranged so that an axis thereof is orthogonal to the ascending and descending direction.

Figure 28:
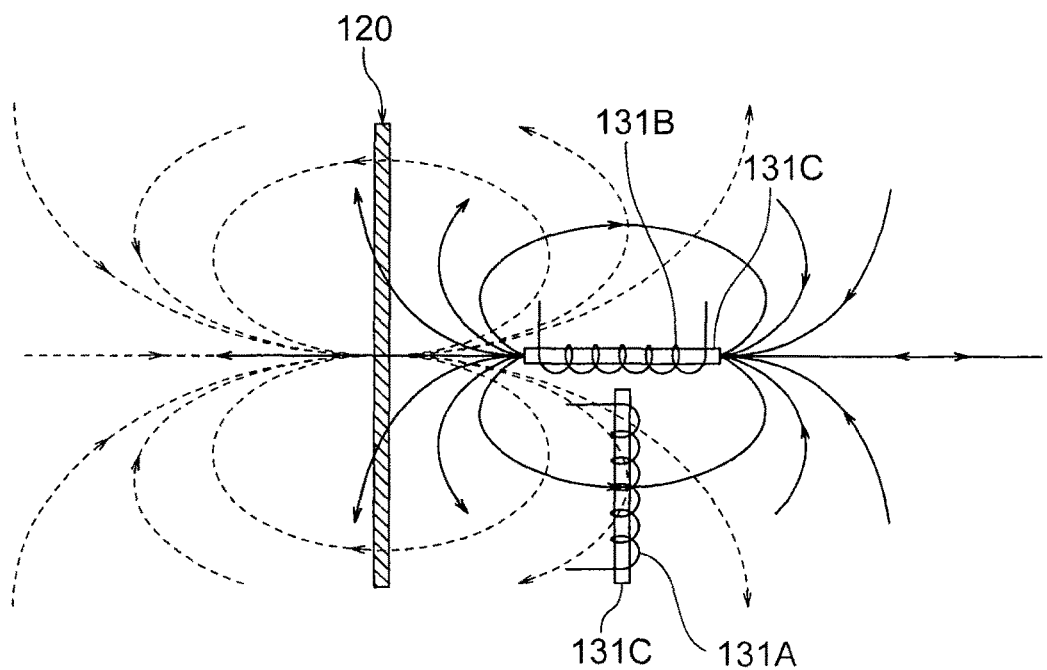
FIG. 28 is an explanatory diagram illustrating the AC magnetic field from an excitation coil of FIG. 27 and the eddy current magnetic field generated on the identification plate.

FIG. 28 is an explanatory diagram illustrating an AC magnetic field from the excitation coil 131B of FIG. 27 and an eddy current magnetic field generated on the identification plate 120. In FIG. 28, magnetic lines of force of the excitation magnetic field are represented by the solid lines, and the direction of the excitation magnetic field is orthogonal to the axial direction of the detection coil 131A. Therefore, the output from the detection coil 131A does not include the AC magnetic field component.

Moreover, in FIG. 28, magnetic lines of force of the eddy current magnetic field are represented by the dotted lines, and the direction of the eddy current magnetic field matches the direction of the axis of the detection coil 131A at the position of the detection coil 131A. Therefore, only the eddy current magnetic field is applied to the detection coil 131A, and only the eddy current magnetic field component is thus output from the detection coil 131A. As a result, the AC magnetic field component removal circuit 133 can be omitted, and the sensor cost can further be decreased.

The modified examples of the identification plate 120 and the modified examples of the sensor 130 can be appropriately combined for embodiment.

Moreover, in the above-mentioned examples, the second-order curve is used as the n-th order curve, but a curve of a higher order may be used. For example, as illustrated in FIG. 19, in a case in which the boundary includes straight line parts, the region S3 (FIG. 15) and the region S4 (FIG. 16) of the eddy current can be made closer to each other.

Second Embodiment

Figure 29:
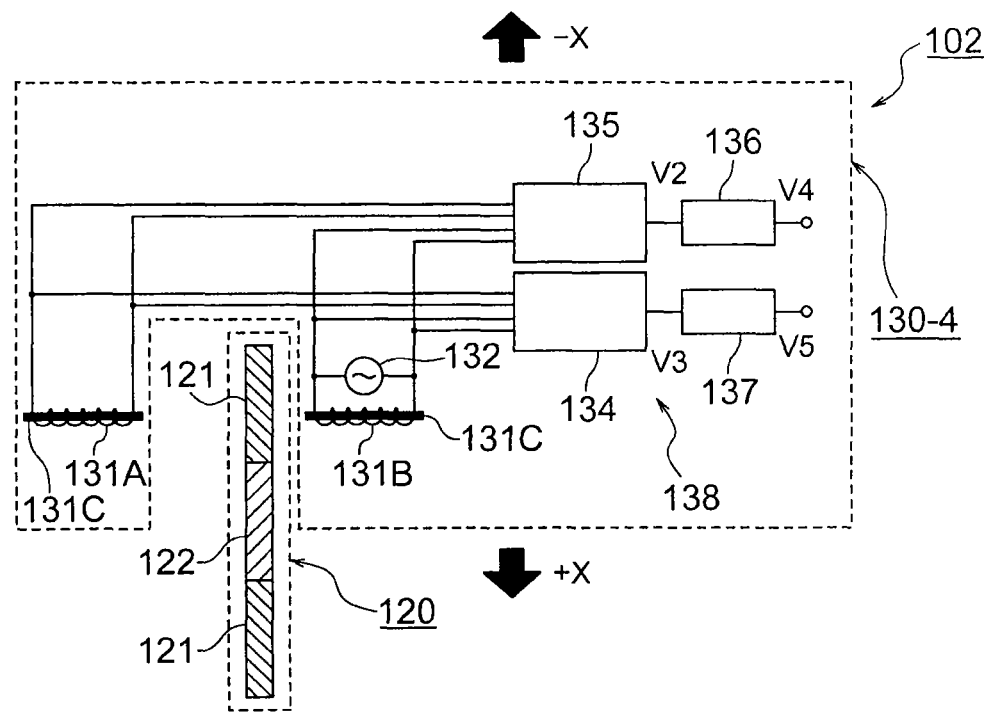
FIG. 29 is a configuration diagram illustrating a car position detection device of a second embodiment of the present invention.

FIG. 29 is a configuration diagram illustrating an elevator car position detection device of a second embodiment of the present invention. In a car position detection device 102 of the second embodiment, the detection coil 131A and the excitation coil 131B are arranged on both sides of the identification plate 120 in the direction orthogonal to the ascending and descending direction. This configuration is the same as the configuration of FIG. 25. Note that, a sensor 130-4 of FIG. 29 is different from the sensor 130-2 of FIG. 25 in such a point that the AC magnetic field component removal circuit 133 is omitted. Then, in the configuration of FIG. 29, the detection coil 131A outputs a voltage acquired by combining the AC magnetic field and the eddy current magnetic field.

Figure 30:
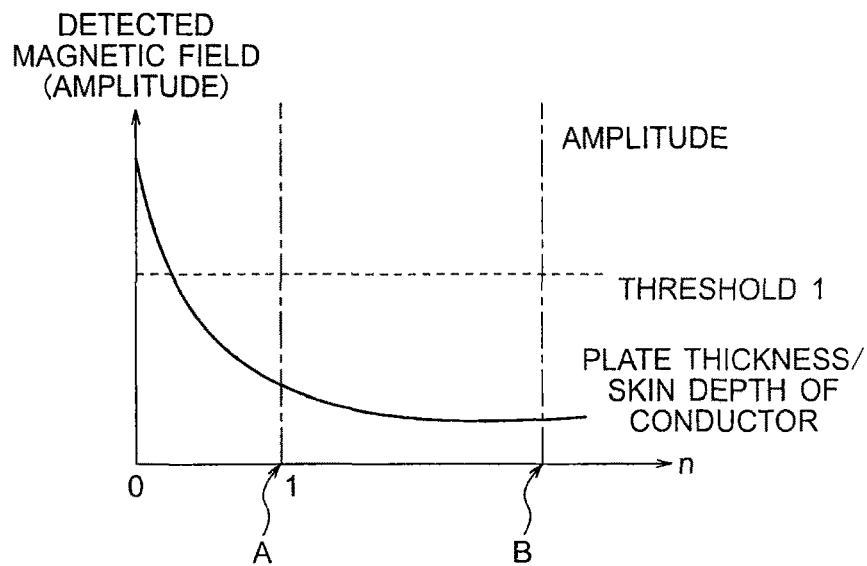
FIG. 30 is a graph showing an example of the relationship between the magnitude (amplitude) of a detected magnetic field and the ratio of the plate thickness to the skin depth of the conductor at the time when the AC magnetic field is applied by a sensor of FIG. 29 to the conductor.

FIG. 30 is a graph showing a relationship between a magnitude (amplitude) of the detected magnetic field (the composite magnetic field of the AC magnetic field and the eddy current magnetic field) and a ratio n ($=d/\delta$) of the plate thickness d to the skin depth $\delta$ of the conductor when the AC magnetic field is applied by the sensor 130-4 of FIG. 29 to the conductor. Moreover, FIG. 31 is a graph showing a relationship between a phase of the detected magnetic field and the ratio of the plate thickness d to the skin depth $\delta$ of the conductor when the AC magnetic field is applied by the sensor 130-4 of FIG. 29 to the conductor.

As shown in FIG. 30, the amplitude of the composite magnetic field shows a tendency to monotonically decrease as n approaches 1 when n≤1, and converge to a certain value as n increases when n>1. On the other hand, as shown in FIG. 31, the phase of the composite magnetic field presents such a behavior as to have a peak, which is maximum, at n=1, and the phase is approximately equal to that for n=0 (no conductor and no eddy current magnetic field) when n>>1.

Figure 31:
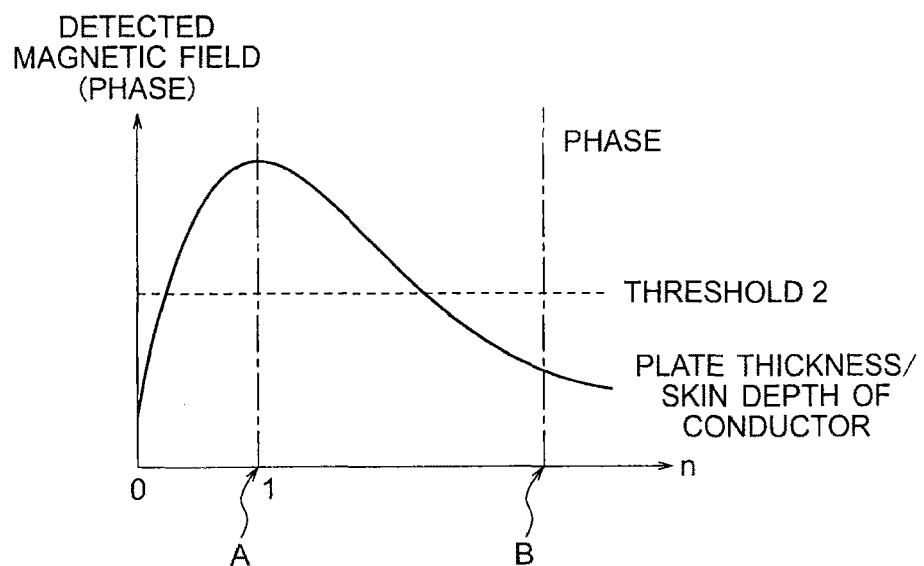
FIG. 31 is a graph showing an example of the relationship between a phase of the detected magnetic field and the ratio of the plate thickness to the skin depth of the conductor at the time when the AC magnetic field is applied by the sensor of FIG. 29 to the conductor.

Thus, as shown on horizontal axes of FIGS. 30 and 31, the plate thickness d and the skin depth $\delta$ of the first conductor 121 are adjusted so that the ratio n of the thickness d of the conductor with respect to the skin depth $\delta$ is "B". Moreover, the plate thickness d and the skin depth $\delta$ of the second conductor 122 are adjusted so that the ratio n is "A".

Further, as illustrated in FIG. 29, the second conductor 122 is positioned to the region in which the re-level zone is to be detected, and the first conductors 121 are each positioned to the region in which the door zone other than the re-level zone is to be detected.

As an example, when the frequency of the AC magnetic field of the AC power supply 132 is 100 kHz, the second conductor 122 is made of non-magnetic stainless steel (SUS304) having a plate thickness of 1.4 mm ($\delta$=1.4 mm), and the first conductor 121 is made of an aluminum alloy (A5052) having a plate thickness of 1 mm ($\delta$=0.36 mm).

Figure 32:
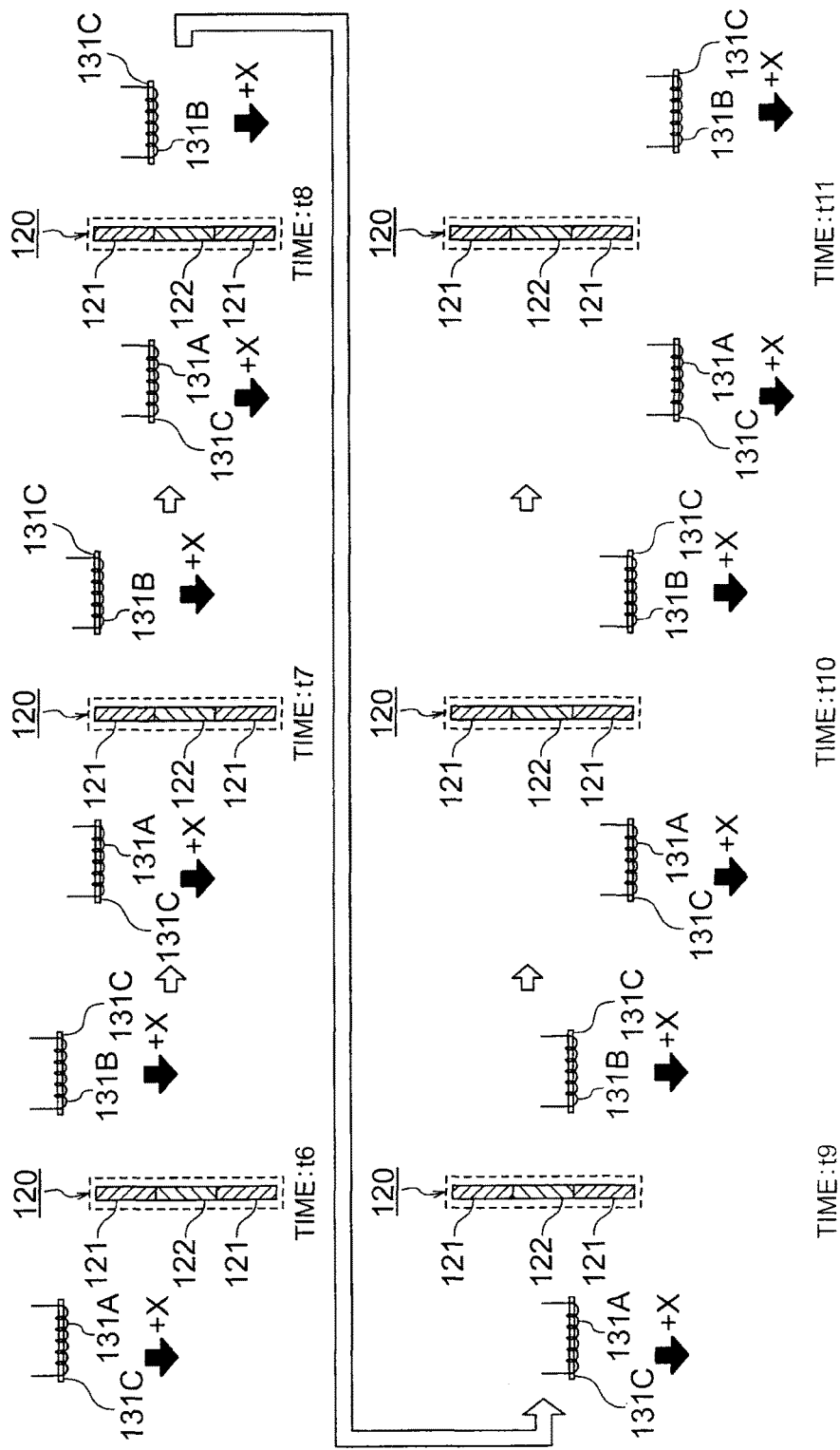
FIG. 32 is an explanatory diagram illustrating an example of a temporal change in a positional relationship between the identification plate and each of the detection coil and the excitation coil of FIG. 29.

A description is now given of an operation of the car position detection device 102. On this occasion, referring to FIG. 32, a description is given of a case in which the sensor 130-4 moves in a direction from an outside of a range of the identification plate 120 toward the identification plate 120, for example, in a +X direction of FIG. 29. FIG. 32 is an explanatory diagram illustrating a change in a positional relationship between the identification plate 120 and each of the detection coil 131A and the excitation coil 131B of FIG. 29 when the time elapses from t6 to t11.

In FIG. 32, the detection coil 131A and the excitation coil 131B are opposed to the conductors 121 and 122 in the identification plate 120 in the order of the first conductor 121 (from t7 to t8)→the second conductor 122 (from t8 to t9)→the first conductor 121 (from t9 to t10).

Figure 33:
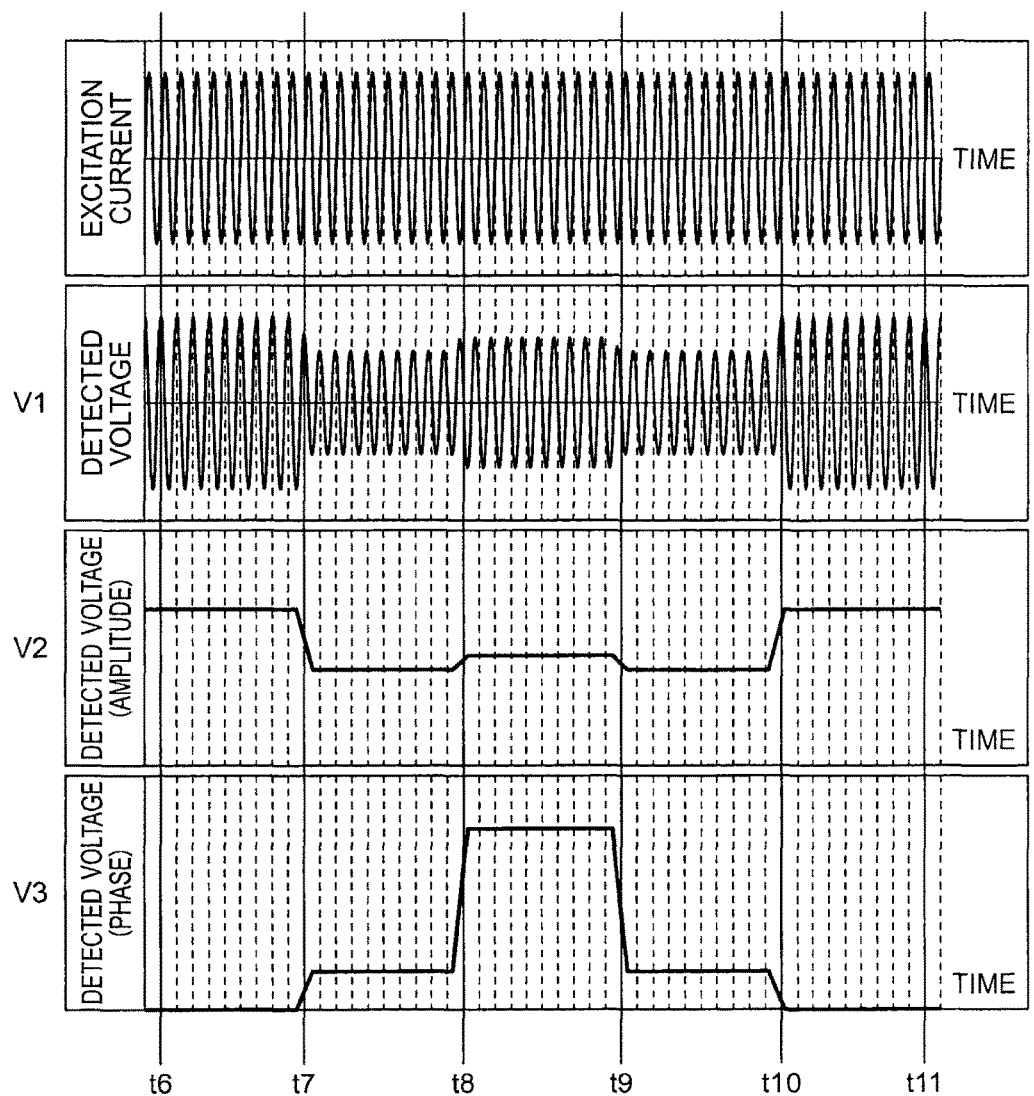
FIG. 33 is a graph showing changes in the excitation current, a detected voltage of the detection coil, the output V2 of the amplitude value detection circuit, and the output V3 of the phase difference detection circuit from a time point t6 to a time point t11 of FIG. 32.

FIG. 33 is a graph showing changes in the excitation current, the detected voltage of the detection coil 131A, the output V2 of the amplitude value detection circuit 135, and the output V3 of the phase difference detection circuit 134 from the time point t6 to the time point t11 of FIG. 32. As apparent from FIG. 33, the values of the outputs V2 and V3 increase and decrease from the time point t7 to the time point t10.

Figure 34:
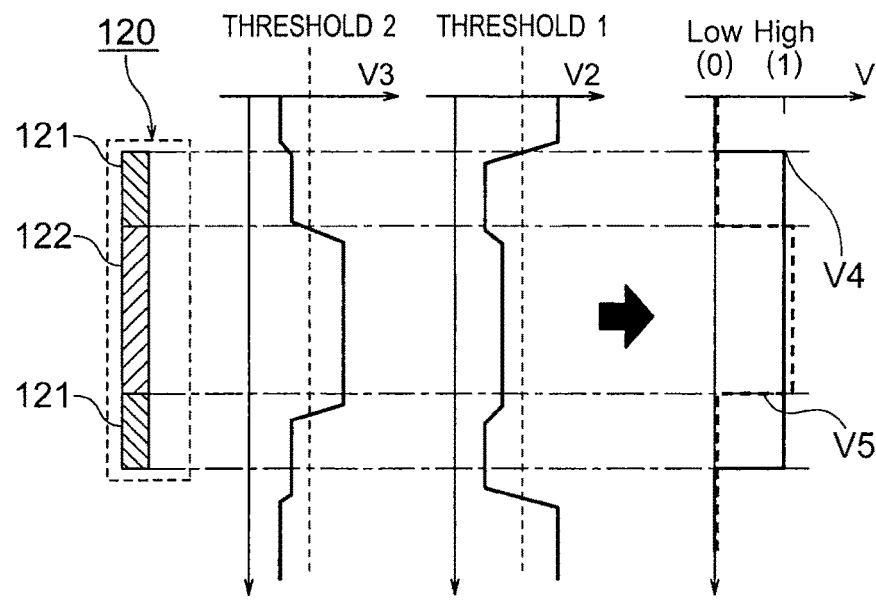
FIG. 34 is an explanatory diagram illustrating a relationship between positions of the detection coil and the excitation coil with respect to the identification plate of FIG. 32 and the voltages V2, V3, V4, and V5.

FIG. 34 is an explanatory diagram illustrating a relationship between positions of the detection coil 131A and the excitation coil 131B with respect to the identification plate 120 of FIG. 32 and the voltages V2, V3, V4, and V5. In FIG. 34, thresholds 1 and 2 are reference voltages for operating comparators 136 and 137, and, by properly setting values thereof, signals V4 and V5 at High (1) and Low(0) corresponding to the door zone and the re-level zone can be independently output from the sensor 130-4.

On this occasion, a description is given of how to set the thresholds 1 and 2 for the respective comparators 136 and 137. In the second embodiment, as illustrated in FIG. 29, the detection coil 131A and the excitation coil 131B are arranged on both sides of the identification plate 120. Therefore, when the car 1 swings during the travel, and the distance between the detection coil 131A and the identification plate 120 increases, the distance between the excitation coil 131B and the identification plate 120 decreases. On this occasion, a ratio of the eddy current magnetic field reaching from the identification plate 120 to the detection coil 131A decreases, but the intensity of the eddy current magnetic field generated from the identification plate 120 increases.

As a result, even when the car 1 swings, the intensity of the eddy current magnetic field applied to the detection coil 131A hardly changes, and the composite magnetic field of the AC magnetic field and the excitation magnetic field output by the detection coil 131A also hardly changes.

Therefore, as shown in FIG. 30, the threshold 1 of the amplitude value comparator 136 for determining the door zone only needs to be set between n=0 (without conductor) and the second conductor 122 (at the position A).

Moreover, as shown in FIG. 31, the threshold 2 of the phase difference comparator 137 for determining the re-level zone only needs to be set between the first conductor 121 (at the position B) and the second conductor 122 (at the position A).

The other configuration and operation are the same as those of the above-mentioned first embodiment, and the shapes of the boundaries of the first and second conductors 121 and 122 may also be the same as those of FIG. 19 or the modified example thereof.

As described above, the car position detection device 102 of the second embodiment can also provide the effects provided by the car position detection device 101 of the first embodiment. Moreover, the car position detection device 102 of the second embodiment omits the AC magnetic field component removal circuit 133, and can thus provide such effects that the sensor cost can be further reduced and the variation of the output signal of the detection coil 131A caused by the swing of the car 1 can be suppressed to be low compared with the car position detection device 101 of the first embodiment.

Third Embodiment

Figure 35:
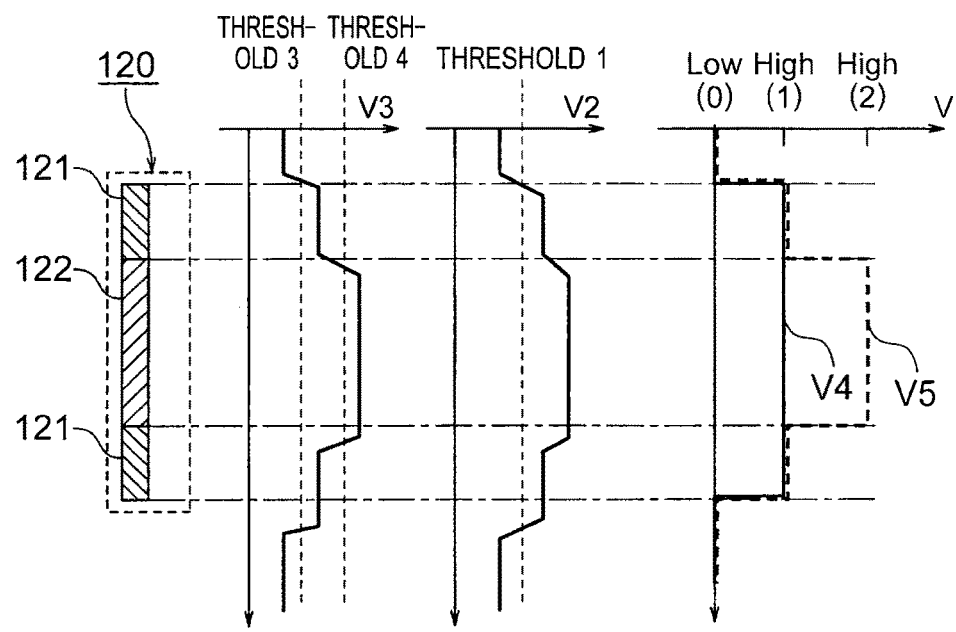
FIG. 35 is an explanatory diagram illustrating a relationship between the positions of the detection coil and the excitation coil with respect to the identification plate of a car position detection device of a third embodiment of the present invention and the voltages V2, V3, V4, and V5.

FIG. 35 is an explanatory diagram illustrating a relationship between the positions of the detection coil 131A and the excitation coil 131B with respect to the identification plate 120 of an elevator car position detection device of a third embodiment of the present invention, the output V2 of the amplitude value detection circuit 135, the output V3 of the phase difference detection circuit 134, the output V4 of the amplitude value comparator 136, and the output V5 of the phase difference comparator 137.

The configuration of the car position detection device of the third embodiment is the same as the configuration of the car position detection device 101 of the above-mentioned first embodiment. Note that, the car position detection device of the third embodiment is different from that of the first embodiment in such a point that two thresholds (a threshold 3 and a threshold 4) are set to the phase difference comparator 137. A detailed description is now given of this different point.

When the sensor 130 moves in the direction from the outside of the range of the identification plate 120 toward the identification plate 120, for example in the +X direction, because the identification plate 120 is the same as that of the first embodiment, the output V3 of the phase difference detection circuit 134 and the output V2 of the amplitude value detection circuit 135 change as illustrated in FIG. 35.

Moreover, the output V2 of the amplitude value detection circuit 135 varies due to the distance variation between the identification plate 120 and the sensor 130 caused by the swing of the car 1, but the output V3 of the phase difference detection circuit 134 hardly varies.

Therefore, as illustrated in FIG. 35, the phase difference comparator 137 can use the threshold 3 and the threshold 4 for the output V3 of the phase difference detection circuit 134 so as to output three output values as the voltage V5. In other words, the output V5 of the phase difference comparator 137 is Low(0) when the output V3 is less than the threshold 3, is High(1) when the output V3 is equal to or more than the threshold 3 and less than the threshold 4, and is High(2) when the output V3 is equal to or more than the threshold 4.

As described above, the car position detection device of the third embodiment can detect the door zone and the re-level zone only based on the output of the phase difference detection circuit 134. Thus, by using, in addition to the output value from the phase difference comparator 137, the output value representing the door zone from the amplitude value comparator 136, the door zone and the re-level zone can be more securely detected.

Note that, in the above-mentioned examples, such matters that the car 1 is positioned in the door zone and the re-level zone are detected, but the position of the car 1 detected by the car position detection device according to the present invention is not limited to the door zone and the re-level zone.

Moreover, in the above-mentioned examples, the two types of the conductors 121 and 122 are provided in the identification plate 120, but three or more types of conductors may be used to identify three or more zones so as to detect the position of the car 1.

The invention claimed is:

1. An elevator car position detection device being configured to detect a position of a car by detecting an identification member by a sensor, wherein:
the sensor comprises a magnetic field generator configured to generate an eddy current magnetic field on the identification member and to output a current waveform, a magnetic field detector configured to detect a magnetic field including the eddy current magnetic field generated in the identification member and to output a voltage waveform that includes an eddy current magnetic field component corresponding to the eddy current magnetic field, and a signal processing part connected to the magnetic field detector, wherein the signal processing part includes
an AC magnetic field component removal circuit configured to extract the eddy current magnetic field component from the voltage waveform output by the magnetic field detector and to output a voltage of the eddy current magnetic field component and
a phase difference detection circuit configured to receive the voltage of the eddy current magnetic field component from the AC magnetic field component removal circuit, to receive the output current waveform from the magnetic field generator, and to detect a difference between a phase of the voltage of the eddy current magnetic field component and a phase of the current waveform received from the magnetic field generator;
the identification member comprises a plurality of conductors which are arranged along an ascending and descending direction of the car, and are relatively different in a plate thickness with respect to a skin depth of an eddy current generated by the magnetic field generator on the identification member;
and
the signal processing part identifies, when the sensor detects the identification member, in which of ranges of the plurality of conductors of the identification member the car is positioned based on (1) information on an amplitude of the eddy current magnetic field acquired from an output of the magnetic field detector, and (2) a value of the difference, detected by the phase difference detection circuit, between the phase of the voltage of the eddy current magnetic field component and the phase of the current waveform received from the magnetic field generator.

2. The elevator car position detection device according to claim 1, wherein the plurality of conductors comprise a conductor larger in the skin depth of the eddy current with respect to the plate thickness and a conductor smaller in the skin depth of the eddy current with respect to the plate thickness.

3. The elevator car position detection device according to claim 1, wherein the skin depths of the eddy current of the plurality of conductors are changed by using different metal species as materials.

4. The elevator car position detection device according to claim 1, wherein the boundary comprises a region of an n-th order curve, provided that n≥1.

5. The elevator car position detection device according to claim 1, wherein the boundary comprises a protruding region that protrudes in the ascending and descending direction of the car at an intermediate part in the direction orthogonal to the ascending and descending direction of the car.

6. The elevator car position detection device according to claim 5, wherein the protruding region is bilaterally symmetrical.

7. The elevator car position detection device according to claim 5, wherein a region of the boundary other than the protruding region is parallel with the direction orthogonal to the ascending and descending direction of the car.

8. The elevator car position detection device according to claim 1, wherein:
a mounting part is mounted on an end of the identification member in the direction orthogonal to the ascending and descending direction of the car, the mounting part being configured to fix the identification member to a hoistway; and
a part in which the plurality of conductors are absent is formed in the end of the identification member on the mounting part side.

9. An elevator car position detection device comprising:
an identification member comprising a plurality of conductors arranged along an ascending and descending direction of an elevator car;
a magnetic field generator configured to generate an eddy current magnetic field in the identification member and to output a current waveform, the plurality of conductors being relatively different in a plate thickness with respect to a skin depth of an eddy current generated by the magnetic field generator on the identification member;
a magnetic field detector configured to detect a magnetic field including the eddy current magnetic field generated in the identification member and to output a voltage waveform that includes an eddy current magnetic field component corresponding to the eddy current magnetic field; and
a signal processing part connected to the magnetic field detector, wherein the signal processing part includes
an AC magnetic field component removal circuit configured to extract the eddy current magnetic field component from the voltage waveform output by the magnetic field detector and to output a voltage of the eddy current magnetic field component; and
a phase difference detection circuit configured to receive the voltage of the eddy current magnetic field component from the AC magnetic field component removal circuit, to receive the current waveform from the magnetic field generator, and to detect a difference between a phase of the voltage of the eddy current magnetic field component and a phase of the current waveform received from the magnetic field generator,
and
wherein the signal processing part identifies, when the magnetic field detector detects the eddy current magnetic field generated in the identification member, in which of ranges of the plurality of conductors of the identification member the car is positioned based on (1) information on an amplitude of the eddy current magnetic field acquired from an output of the magnetic field detector, and (2) a value of the difference, detected by the phase difference detection circuit, between the phase of the voltage of the eddy current magnetic field component and the phase of the current waveform received from the magnetic field generator.

10. The elevator car position detection device according to claim 9, wherein the plurality of conductors comprise a conductor larger in the skin depth of the eddy current with respect to the plate thickness and a conductor smaller in the skin depth of the eddy current with respect to the plate thickness.

11. The elevator car position detection device according to claim 9, wherein the skin depths of the eddy current of the plurality of conductors are changed by using different metal species as materials.

12. The elevator car position detection device according to claim 9, wherein the boundary comprises a region of an n-th order curve, provided that n≥1.

13. The elevator car position detection device according to claim 9, wherein the boundary comprises a protruding region that protrudes in the ascending and descending direction of the car at an intermediate part in the direction orthogonal to the ascending and descending direction of the car.

14. The elevator car position detection device according to claim 13, wherein the protruding region is bilaterally symmetrical.

15. The elevator car position detection device according to claim 13, wherein a region of the boundary other than the protruding region is parallel with the direction orthogonal to the ascending and descending direction of the car.

16. The elevator car position detection device according to claim 9, wherein:
a mounting part is mounted on an end of the identification member in the direction orthogonal to the ascending and descending direction of the car, the mounting part being configured to fix the identification member to a hoistway; and
a part in which the plurality of conductors are absent is formed in the end of the identification member on the mounting part side.

17. The elevator car position detection device according to claim 1, wherein a shape of at least a part of a boundary between adjacent ones of the plurality of conductors is a curve tilted with respect to a direction orthogonal to the ascending and descending direction of the car.

18. The elevator car position detection device according to claim 1, wherein a shape of at least a part of a boundary between adjacent ones of the plurality of conductors is a straight line tilted with respect to a direction orthogonal to the ascending and descending direction of the car.

19. The elevator car position detection device according to claim 9, wherein a shape of at least a part of a boundary between adjacent ones of the plurality of conductors is a curve tilted with respect to a direction orthogonal to the ascending and descending direction of the car.

20. The elevator car position detection device according to claim 9, wherein a shape of at least a part of a boundary between adjacent ones of the plurality of conductors is a straight line tilted with respect to a direction orthogonal to the ascending and descending direction of the car.

* * * * *